(12) United States Patent
Ikeda et al.

(10) Patent No.: US 7,347,603 B2
(45) Date of Patent: Mar. 25, 2008

(54) LIGHT-EMITTING DIODE

(75) Inventors: Tadaaki Ikeda, Kagoshima (JP); Shinji Tokutomi, Kagoshima (JP); Noriaki Koga, Kagoshima (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 288 days.

(21) Appl. No.: 10/532,813

(22) PCT Filed: Nov. 4, 2003

(86) PCT No.: PCT/JP03/14048

§ 371 (c)(1),
(2), (4) Date: Apr. 26, 2005

(87) PCT Pub. No.: WO2004/042833

PCT Pub. Date: May 21, 2004

(65) Prior Publication Data

US 2006/0050526 A1    Mar. 9, 2006

(30) Foreign Application Priority Data

| Nov. 5, 2002 | (JP) | ............................. 2002-320889 |
| Aug. 5, 2003 | (JP) | ............................. 2003-286672 |
| Aug. 5, 2003 | (JP) | ............................. 2003-286673 |
| Aug. 20, 2003 | (JP) | ............................. 2003-296065 |
| Aug. 25, 2003 | (JP) | ............................. 2003-299590 |
| Sep. 1, 2003 | (JP) | ............................. 2003-308563 |
| Sep. 1, 2003 | (JP) | ............................. 2003-308564 |

(51) Int. Cl.
*F21V 7/04* (2006.01)

(52) U.S. Cl. ........................ 362/555; 362/327; 257/98; 313/512

(58) Field of Classification Search ................ 362/545, 362/555, 327, 800; 257/98–100; 313/512
See application file for complete search history.

(56) References Cited

U.S. PATENT DOCUMENTS 4,767,172 A    8/1988   Nichols et al.

(Continued)

FOREIGN PATENT DOCUMENTS

EP    1 011 151 A2    6/2000

(Continued)

OTHER PUBLICATIONS

European Search Report issued in corresponding European Patent Application No. EP 03 77 0119, dated Sep. 1, 2006.

(Continued)

*Primary Examiner*—Stephen F Husar
(74) *Attorney, Agent, or Firm*—McDermott Will & Emery LLP

(57) ABSTRACT

A light-emitting diode 1 according to the present invention includes: a semiconductor light-emitting device 4 mounted on the surface of lead frames 2 and 3; and a transparent resin package 5 covering the front side of the semiconductor light-emitting device 4. A convex lens portion 8 for concentrating light emitted from the semiconductor light-emitting device 4 toward the front is provided in a surface part of the resin package 5. A circular flat portion 11 for diffusing light emitted from the semiconductor light-emitting device 4 toward the sides is provided in a part of the convex lens portion 8 intersecting the optical axis of the convex lens portion 8. Part of the convex lens portion 8 surrounding the circular flat portion 11 is a convex-lens side face. A recess 7 whose side wall is partly the convex-lens side face is provided to surround the convex lens portion.

25 Claims, 9 Drawing Sheets

U.S. PATENT DOCUMENTS

| | | |
|---|---|---|
| 5,485,317 A | 1/1996 | Perissinotto et al. |
| 6,060,729 A | 5/2000 | Suzuki et al. |
| 6,355,946 B1 | 3/2002 | Ishinaga |
| 6,573,653 B1 | 6/2003 | Ishinaga |
| 2002/0084462 A1 | 7/2002 | Tamai et al. |
| 2002/0085390 A1 | 7/2002 | Kiyomoto et al. |

FOREIGN PATENT DOCUMENTS

| | | |
|---|---|---|
| EP | 1 130 660 A1 | 9/2001 |
| JP | 52-7580 | 1/1977 |
| JP | 59-010288 | 1/1984 |
| JP | 62-073563 A | 5/1987 |
| JP | 737044 | 6/1988 |
| JP | 64-49987 | 3/1989 |
| JP | 01-130578 | 5/1989 |
| JP | 1-162261 | 11/1989 |
| JP | 1-273367 | 11/1989 |
| JP | 06-216411 | 8/1994 |
| JP | 07-058362 | 3/1995 |
| JP | 06-107235 | 4/1996 |
| JP | 8-162672 | 6/1996 |
| JP | 8-306959 | 11/1996 |
| JP | 11-26647 | 1/1999 |
| JP | 11-112036 | 4/1999 |
| JP | 11-121809 | 4/1999 |
| JP | 11-167805 | 6/1999 |
| JP | 11-220181 | 8/1999 |
| JP | 11-298048 | 10/1999 |
| JP | 1051396 | 10/1999 |
| JP | 2001-60724 | 3/2001 |
| JP | 2001-185763 | 7/2001 |
| JP | 2001-196644 | 7/2001 |
| JP | 2001-237463 | 8/2001 |
| JP | 2002-141558 | 5/2002 |
| JP | 2002-303867 | 10/2002 |
| JP | 2003-512727 | 4/2003 |
| WO | WO 01/29904 A1 | 4/2001 |

OTHER PUBLICATIONS

Japanese Office Action with English translation issued in corresponding Japanese Patent Application No. JP 2003-286673, mailed Mar. 6, 2007.
Japanese Office Action with English translation issued in corresponding Japanese Patent Application No. JP 2003-299590, mailed Mar. 6, 2007.
Japanese Office Action with English translation issued in corresponding Japanese Patent Application No. JP 2003-308563, mailed Mar. 6, 2007.
Japanese Office Action with English translation issued in corresponding Japanese Patent Application No. JP 2003-308564, mailed Mar. 6, 2007.
Notice of Reasons for Rejection dated Jul. 10, 2007 Issued in corresponding Japanese Patent Application No. 2003-308583.
Decision of Rejection dated Oct. 30, 2007 issued in corresponding Japanese Patent Application No. 2003-308563.

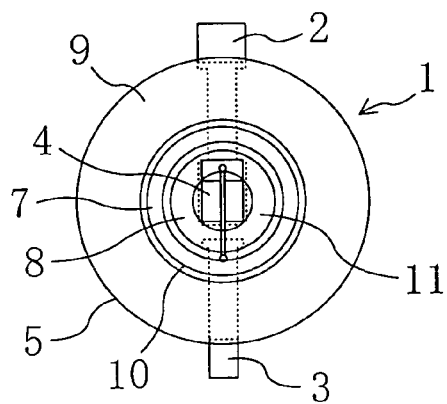
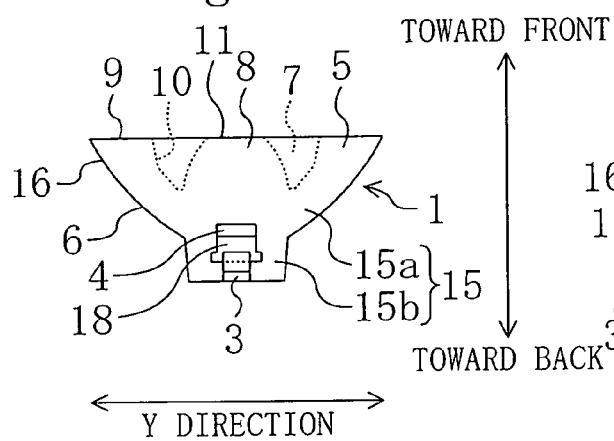
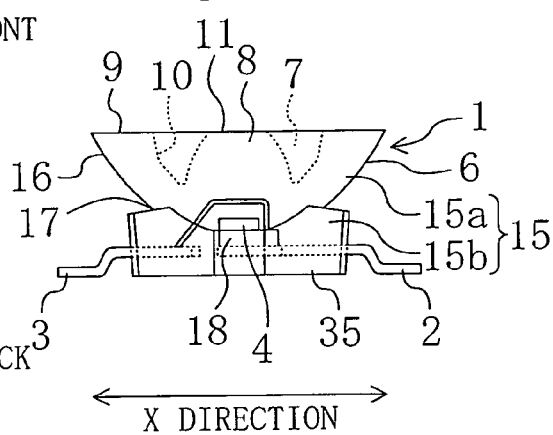
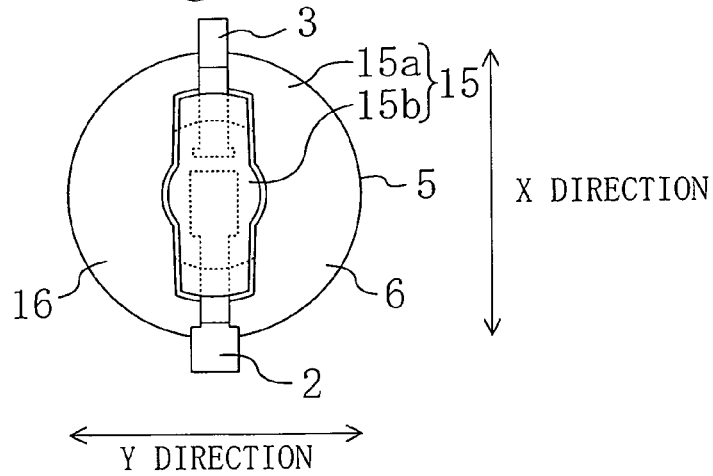

— 0_degrees
········ 90 degrees

| LUMINOUS INTENSITY | |
|---|---|
| ON THE AXIS | 1.32 |
| 62° | 0.82 |
| LUMINOUS INTENSITY PROPORTION | 62% |

— 0_degrees
········ 90 degrees

| LUMINOUS INTENSITY | |
|---|---|
| ON THE AXIS | 1.6 |
| 62° | 0.71 |
| LUMINOUS INTENSITY PROPORTION | 44% |

LIGHT-EMITTING DIODE

TECHNICAL FIELD

The present invention relates to light-emitting diodes including semiconductor light-emitting devices and transparent resin packages covering the semiconductor light-emitting devices.

BACKGROUND ART

In recent years, cellular phones equipped with cameras have become dominant for domestic use, and thus small, thin and bright light sources for flashes capable of taking pictures even in dark places have been required. To meet this requirement, light-emitting diodes (LEDs) are promising. However, if light-emitting diodes are used under normal conditions, only insufficient luminance is obtained in many cases. To avoid this, attempts have been made to provide resin packages covering semiconductor light-emitting devices with a function as lenses.

Examples of use of resin packages as lenses include the following configurations. In Japanese Unexamined Patent Publication (Kokai) No. 1-273367 (pp. 1-4, FIG. 3) (hereinafter referred to as Reference 1), disclosed is a configuration in which a semiconductor light-emitting device mounted on a lead member is covered with a resin package and plating is performed on the convex surface of the resin package, thereby forming a concave mirror such that light is reflected from the surface of this concave mirror and released toward the back to be concentrated.

In Japanese Unexamined Patent Publication (Kokai) No. 8-306959 (pp. 2-3, FIG. 2) (hereinafter referred to as Reference 2), disclosed is a configuration in which a semiconductor light-emitting device mounted on a lead member is covered with a resin package and a recessed part and a convex lens part formed in this recessed part are formed on a light-emitting surface of the resin package so that light emitted toward the front of the semiconductor light-emitting device is released through the convex lens to be concentrated.

In Japanese Design Gazette No.: Similar Design 1 of Japanese Design Gazette No. 737044 (hereinafter referred to as Reference 3), disclosed is a configuration in which a recessed part and two convex lens parts formed in the recessed part are provided on a light-emitting surface of a resin package.

In Japanese Utility Model Publication No. 52-7580 (pp. 1-8, FIG. 6) (hereinafter referred to as Reference 4), disclosed is a configuration in which a light-emitting diode and a transparent part made of a synthetic resin are provided on the surface of a board so that this transparent part allows total reflection of light emitted from the light-emitting diode.

In Japanese Design Gazette No. 1051396 (A-A line cross-sectional view) (hereinafter referred to as Reference 5), disclosed is a configuration in which a semiconductor light-emitting device mounted on a lead member is covered with a resin package, the lead member projects toward the back, the base of the resin package is cylindrical and holds the lead member, and the diameter of the resin package gradually increases toward the front. In this configuration, total reflection of light emitted from the semiconductor light-emitting device toward the sides occurs at the peripheral face of the front part of the resin package, and the reflected light is released toward the front.

PROBLEMS TO BE SOLVED

However, the conventional light-emitting diodes have a drawback in which light from a semiconductor light-emitting device is not efficiently released from a light-emitting surface and thus luminance is not enhanced. Specifically, in the light-emitting diode disclosed in Reference 2, light emitted from the semiconductor light-emitting device toward the sides is released to the outside as it is from the side face of the resin package, resulting in wasting a large amount of light. In the light-emitting diode disclosed in Reference 3, two semiconductor light-emitting devices are used and light emitted from the semiconductor light-emitting devices toward the front is concentrated by two convex lens portions. However, light emitted from the devices toward the sides is released to the outside from the side face of the resin package, and thus a large amount of light is also wasted.

The conventional light-emitting diodes have another drawback in which light is not uniformly emitted. Specifically, in the light-emitting diode disclosed in Reference 1, light reflected from the concave mirror strikes the semiconductor light-emitting device and the lead member for supporting the device, and the light is blocked thereby. Accordingly, a center part of an irradiation field is dark and light is not uniformly emitted. In the light-emitting diode disclosed in Reference 2, the convex lens is used, so that a center part of an irradiation field is excessively bright and light is not uniformly emitted, either.

The conventional light-emitting diodes have still another drawback in which a resin package is readily disconnected from a supporting member such as a lead frame. Specifically, in the configuration disclosed in Reference 1, if a metal reflective face is formed by plating or metal vapor deposition, the connection between the resin package and the metal film is broken during reflow heating for surface mounting, a thermal-shock test or other processes. In the light-emitting diode disclosed in Reference 4, the top portion of the transparent part on the board is larger than its base part, so that the base part is readily separated from the board.

In the conventional light-emitting diodes have yet another drawback in which high-density integration and miniaturization are not implemented. Specifically, the configuration disclosed in Reference 5 is not applicable to apparatus for surface mounting, so that high-density integration is not achieved. In addition, a wide part extends toward the back from the base part of the lead frame on which the semiconductor light-emitting device is mounted. Accordingly, the base of the resin package is long along the optical axis and the entire light-emitting diode is thick. Therefore, this configuration is not applicable to equipment which needs to be thin. In the configuration disclosed in Reference 1, if the diameter is reduced, the area ratio of the blocking surface to the light-emitting surface increases. Therefore, this configuration does not meet miniaturization.

The conventional light-emitting diodes have another drawback in which each light-emitting diode is mounted on a circuit board or the like in a limited orientation depending on the arrangement of lead members. Specifically, in the light-emitting diode disclosed in Reference 1, all the lead members extend from one side, so that these lead members cannot be connected in different directions when mounted on the circuit board. In the light-emitting diode disclosed in Reference 2, three terminals are arranged asymmetrically at both sides, so that this light-emitting diode is mounted on the circuit board only in one orientation. If the light-emitting diode is mounted in the reversed orientation, the lead members are not connected thereto. If an even number of terminals are arranged symmetrically, the lead members can be mounted in the direction opposite to a given direction. However, the semiconductor light-emitting device has a polarity and, if a reverse voltage is applied, the device does not emit light or is broken. Therefore, the polarity of a light-emitting diode should be checked before shipment and packaging thereof.

DISCLOSURE OF INVENTION

An object of the present invention is to provide a high-luminance light-emitting diode capable of emitting light uniformly. Other objects of the present invention are: suppressing removal of components from supporting members such as lead frames; enabling high-density packaging and miniaturization; and enabling emission of light in the same conditions regardless of the orientation of a device.

A first light-emitting diode according to the present invention includes: at least one semiconductor light-emitting device mounted over the surface (upper face) of a lead frame; and a transparent resin package covering the semiconductor light-emitting device. The resin package includes: a base portion covering a base part of the lead frame; an expansion portion provided at a side of the base portion toward a principal-light-emitting surface of the semiconductor light-emitting device and having a side face which is a first curved face capable of causing total reflection of light emitted from the semiconductor light-emitting device and making the reflected light released toward the front; and a contraction portion located between the expansion portion and the base portion and has a lateral cross section smaller than a maximum lateral cross section of the base portion.

In this device, with the expansion portion, light emitted from the semiconductor light-emitting device toward the sides and incident on the curved face is reflected toward the front, i.e., in the direction in which principal light of the semiconductor light-emitting device is emitted, and light emitted toward the sides is concentrated without loss, thus enhancing luminance. In addition, the contraction portion is provided, so that it is also possible to prevent the area of the curved face of the expansion portion from decreasing. Furthermore, the area of the back surface of the resin package is increased by providing the base portion, so that a part supporting the resin package is enlarged to enhance the stability.

A convex lens portion for concentrating, toward the front, light emitted from the semiconductor light-emitting device is preferably provided in a surface part of the resin package, and a diffusing part for diffusing light emitted from the semiconductor light-emitting device toward the sides is preferably formed in a part of the convex lens portion intersecting an optical axis of the convex lens portion. In this case, light traveling toward the outside of an irradiation field in a conventional device is concentrated in the irradiation field by the convex lens portion so that luminance is enhanced. In addition, the diffusing part prevents the luminance from being high only in a center part of the irradiation field. Accordingly, the luminance of an entire given field is made uniform. The irradiation field herein is an area which needs to be irradiated with light such as a shooting area.

The diffusing part enlarges a light distribution area by refracting light beams emitted from a point such that the optical paths of the light beams do not overlap with each other. The diffusing part is different from a member which scatters light by containing a filler or the like.

If the diffusing part is flat, light emitted from the semiconductor light-emitting device is refracted at the diffusing part, so that the light distribution area is enlarged. In addition, the shape is simplified, thus enhancing the yield.

A part of the convex lens portion surrounding the diffusing part is preferably a convex-lens side face, and a recess whose side wall is preferably partly the convex-lens side face is provided to surround the convex lens portion. In such a case, light which are not concentrated in a given field by the convex lens portion is released to the outside of the recess and the area except for the given field is not irradiated. Accordingly, irradiation of light can be performed more uniformly.

If the first curved face of the expansion portion has a lateral cross section including an arc using an optical axis of the semiconductor light-emitting device as the center of the arc, light emitted from the semiconductor light-emitting device toward the sides and incident on the first curved face is reflected toward the front over the plane including the optical axis of the semiconductor light-emitting device. Accordingly, the light is concentrated without loss and luminance is enhanced.

A plurality of said semiconductor light-emitting devices are preferably provided, and the first curved face of the expansion portion preferably has a lateral cross section formed by connecting arcs using optical axes of the semiconductor light-emitting devices as the centers of the arcs. In such a case, light incident on the expansion portion at the lateral cross section from a semiconductor light-emitting device is emitted along a plane including this semiconductor light-emitting diode. Accordingly, luminance is enhanced and reflected light is uniformly diffused.

If the first curved face of the expansion portion includes a paraboloid of revolution, light traveling from the center axis of the paraboloid toward the sides strikes the paraboloid at a given incident angle, and total reflection of this light occurs such that the reflected light is released toward the front.

In this case, if the lead frame projects sideways, apparatus applicable to surface mounting is made thin.

Part of the lead frame preferably projects from the resin package, the base portion preferably projects from the contraction portion along the direction in which the lead frame projects, and a backside end of the base portion preferably has a width equal to that of a front-side end of the contraction portion in a direction perpendicular to the direction in which the lead frame projects. In such a case, strength against disconnection of the lead frame to the side is enhanced. At the same time, it is possible to prevent the area of the expansion portion from decreasing in a portion except for the direction in which the lead frame projects. Accordingly, luminance is enhanced.

If the semiconductor light-emitting device is mounted over the lead frame with a submount device interposed therebetween, the semiconductor light-emitting device is located closer to the front than the lead frame is. Accordingly, the amount of light emitted from the semiconductor light-emitting device and traveling toward the front from the contraction portion is increased, thus enhancing luminance.

If a phosphor is printed on the semiconductor light-emitting device, the thickness of the phosphor is reduced so that enlargement of the light source is prevented. In addition, the angle of light reflected from the expansion portion is within a given range so that most of the light is totally reflected and luminance is enhanced.

If a plurality of said semiconductor light-emitting devices are provided, and the semiconductor light-emitting devices are arranged along a direction perpendicular to the direction in which the lead frame projects, the lead frame projects from the outer face of the expansion portion, so that the stability of the light-emitting diode is enhanced.

If the lead frame bends into a gull-wing shape, light emitted from the light-emitting device toward the sides and incident on the curved face is reflected to the front, i.e., the direction in which principal light of the semiconductor light-emitting device is emitted. Accordingly, the light emitted toward the sides is concentrated without loss, and luminance is enhanced.

The optical axis of the convex lens portion preferably coincides with an optical axis of the semiconductor light-emitting device.

If no part of the convex lens portion projects from a portion of the surface of the resin package closest to the front, an adsorption jig is not in contact with the convex lens portion during automatic mounting, so that it is possible to prevent scratches from occurring on the convex lens portion or the light-emitting diode from tilting during adsorption.

A plurality of said semiconductor light-emitting devices may be provided, and the convex lens portion may be provided in each of the semiconductor light-emitting devices. In this case, the convex lens portion is provided for each semiconductor light-emitting device. Accordingly, light distribution directions of the respective light-emitting devices are substantially the same, so that variation in direction at the light distribution peak is prevented. As a result, the luminance of the light-emitting diode is further enhanced.

If at least three said semiconductor light-emitting devices emitting red light, green light and blue light, respectively, are provided, the output of each light-emitting device is adjusted to produce white light or full-color light so that white light close to natural light is obtained.

A plurality of said semiconductor light-emitting devices emitting light of the same color may be provided, the semiconductor light-emitting devices may include p-electrodes and n-electrodes, the lead frame may include a first frame connected to the p-electrodes and provided with a pair of terminals projecting from the resin package in plan view and also include a second frame connected to the n-electrodes and provided with a pair of terminals projecting from the resin package in plan view, the terminals of the first frame may be point symmetric with respect to a center of the resin package, and the terminals of the second frame may be point symmetric with respect to the center of the resin package. In this case, even if the light-emitting diode is rotated 180° and mounted and a voltage is applied thereto, current flows in the same direction as in a case where the diode is not rotated. Therefore, even if the orientation of the lead frame is reversed during packaging, no damage occurs.

If the terminals of the first frame are continuous, and the terminals of the second frame are apart from each other with the first frame sandwiched therebetween, the strength of the lead frames increases, so that strength against disconnection is enhanced.

If head parts of the respective terminals of the first frame are parallel to head parts of the respective terminals of the second frame, and the semiconductor light-emitting devices are arranged along a direction perpendicular to the head parts of the terminals of the first frame and the head parts of the terminals of the second frame, the light-emitting diode of a surface mounting type is formed. In addition, the distance between a pair of terminals is adjusted in accordance with the distance between semiconductor light-emitting devices. Accordingly, the apparatus is made thin and miniaturized.

The first frame preferably includes a device fixing part for fixing back faces of the semiconductor light-emitting devices, the terminals of the first frame preferably extend in opposite directions respectively from both ends of the device fixing part along a direction perpendicular to a longitudinal direction of the device fixing part, and base parts of the respective terminals of the second frame are preferably located near the device fixing part, and head parts of the respective terminals of the second frame are preferably parallel to the terminals of the first frame. In such a case, the pair of terminals is not readily disconnected from the resin package. Accordingly, wire is not broken so that the reliability of the apparatus is enhanced.

If a base part of each of the terminals of the second frame bends toward adjacent one of the terminals of first frame in the resin package, the pair of terminals is not readily disconnected from the resin package, so that the reliability of the product is enhanced.

A second light-emitting diode according to the present invention includes: at least one semiconductor light-emitting device mounted over the surface of a printed wiring board; and a transparent resin package covering a front side of the semiconductor light-emitting device. The resin package includes an expansion portion having a side face which is a first curved face capable of causing total reflection of light emitted from the semiconductor light-emitting device toward the sides and making the reflected light released toward the front, and the semiconductor light-emitting device is mounted in a recess provided in the printed wiring board.

In this diode, light emitted from the light-emitting device to the back is reflected toward the front, so that leakage of light toward the back is prevented. If the light-emitting device is mounted in a recess formed in the printed wiring board, all light emitted toward the back and obliquely toward the back of the semiconductor light-emitting device is reflected so that the luminance on the surface in the optical axis direction is enhanced.

If a side face of the recess in the printed wiring board expands toward the front, and a part of the resin package in contact with the side face of the recess is a second curved face, the recess formed in the board makes the shape of the contact face between the resin package and the board more complicated than in the case of a flat surface and also makes the contact area increased. Accordingly, strength against disconnection is enhanced and the resin package is firmly fixed. In addition, light emitted from the light-emitting device toward the sides is reflected from the first and second curved faces, so that the light emitted toward the sides is concentrated without loss, and luminance is enhanced.

If a backside end of the first curved face is connected to a front-side end of the second curved face, out of light beams emitted toward the front of the resin package, the distance between light reflected from the first curved face and light reflected from the second curved face is reduced, so that decrease of luminance is suppressed.

If an electrode made of a metal is provided on part of the surface of the printed wiring board, and a film made of the same metal as the metal constituting the electrode is interposed between the second curved face of the resin package and the printed wiring board, the electrode also serves as a reflective face, thus enhancing reflectance of light and efficiency in fabrication.

BRIEF DESCRIPTION OF DRAWINGS

FIG. 1(A) is a plan view showing a light-emitting diode according to a first embodiment of the present invention. FIG. 1(B) is a front view of the light-emitting diode. FIG. 1(C) is a side view of the light-emitting diode. FIG. 1(D) is a bottom view of the light-emitting diode.

FIG. 11(A) is a plan view showing a light-emitting diode according to a sixth embodiment of the present invention. FIG. 11(B) is a cross-sectional view showing the light-emitting diode.

FIG. 12(A) is a plan view before a resin package for a light-emitting diode according to a seventh embodiment of the present invention is formed. FIG. 12(B) is a side cross-sectional view before the resin package of the light-emitting diode is formed.

BEST MODE FOR CARRYING OUT THE INVENTION

Embodiment 1

Figure 2A:
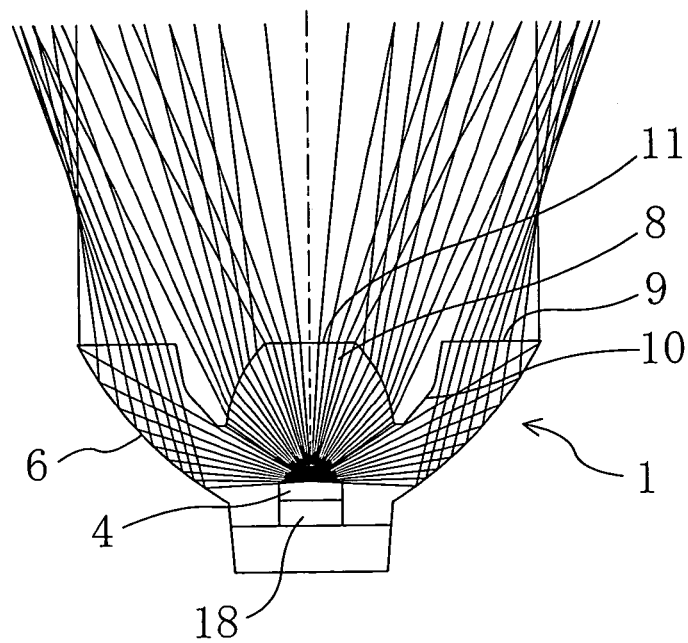
FIGS. 2(A) and 2(B) are illustrations showing optical paths of light emitted from a semiconductor light-emitting device.

FIG. 1(A) is a plan view showing a light-emitting diode according to a first embodiment of the present invention. FIG. 1(B) is a front view of the light-emitting diode. FIG. 1(C) is a side view of the light-emitting diode. FIG. 1(D) is a bottom view of the light-emitting diode.

As shown in FIG. 1, a light-emitting diode 1 includes: a semiconductor light-emitting device 4 mounted over lead frames 2 and 3; and a transparent resin package 5 covering the semiconductor light-emitting device 4.

The lead frames 2 and 3 are formed by bending, into a gull-wing shape, a plate member obtained by, for example, applying a Ni/Ag coating to a Cu alloy or others. More specifically, the lead frames 2 and 3 extend from base parts thereof over which the semiconductor light-emitting device 4 is mounted, project from both sides of the resin package 5, bend backward and then outward, and extend to the outside at the both sides.

The semiconductor light-emitting device 4 in the shape of a rectangular solid is mounted on a submount device 18 by flip-chip bonding. An electrode provided on the back face of the submount device 18 is connected to the lead frame 2 by die bonding and an electrode provided on the front face of the submount device 18 is connected to the other lead frame 3 by wire bonding.

In this embodiment, the face of the lead frame 2 to which the semiconductor light-emitting device 4 is connected, or the face of the semiconductor light-emitting device 4 from which principal light is emitted is herein referred to as the front side or the front face, and the opposite face is herein referred to as the backside or the back face.

The resin package 5 is made of, for example, a resin such as transparent epoxy resin and has an outer shape of substantially an inverted bullet projecting toward the back from the front face. The resin package 5 includes: a lens portion 15a at the front side; and a base portion 15b at the backside (shown in FIG. 1(C).) The base portion 15b is cylindrical, provided at the backside of the semiconductor light-emitting device 4, and cured to cover opposed ends of the lead frames 2 and 3. The base portion 15b is cylindrical at the back face of the semiconductor light-emitting device 4 and juts out from the sides of the cylinder in the direction in which the lead frames 2 and 3 project. That is, the base portion 15b is composed of a cylindrical part for holding the semiconductor light-emitting device 4 and rectangular-solid parts located at the sides of the cylindrical part and each supporting an end of one of the lead frames 2 and 3.

The back face of this base portion 15b is substantially flush with the back face of the outer ends of the respective lead frames 2 and 3. The expression, "substantially flush with" includes not only a case where these faces are at the same level but also a case where the back faces of the lead frames 2 and 3 are at a level slightly higher than the back face of the base portion 15b. It is assumed that if the lead frames 2 and 3 are in contact with solder applied to a circuit board with the back face of the base portion 15b of the light-emitting diode 1 being in contact with the circuit board, the back face of the base portion 15b is substantially flush with the back faces of the outer ends of the respective lead frames 2 and 3.

On the other hand, the back face of the lens portion 15a is a curved face 6 formed by a paraboloid of revolution. The center line of the paraboloid forming the curved face 6 is vertical to the surface of the lead frame 2. The focal point of the paraboloid is on the optical axis of the semiconductor light-emitting device 4. As shown in FIG. 1(C), in the X direction in which the lead frames 2 and 3 project, a contraction portion 17 is provided in part of the lens portion 15a at a step between the lens portion 15a and the base portion 15b. The contraction portion herein means a part of the lens portion 15a whose lateral cross-sectional area is smaller than that of the base portion 15b. If the shape of the lateral cross section of the base portion 15b changes depending on the location, the maximum lateral cross-sectional area of the base portion 15b is used for comparison. Part of the lens portion 15a on the front side of the contraction portion 17 is an expansion portion 16 having the curved face 6. In this embodiment, as shown in FIG. 1(C), the contraction portion 17 is narrower than the base portion 15b when viewed in the X direction. As shown in FIG. 1(B), when viewed in the Y direction perpendicular to the X direction, the contraction portion 17 is not narrower than the base portion 15b and the lower end of the contraction portion 17 is connected to the upper end of the base portion 15b. As shown in FIGS. 1(B) and 1(C), both ends of the expansion portion 16 when viewed in the Y direction are located at the inside of and below (at the backside of) these ends when viewed in the X direction.

The resin package 5 has an annular flat portion 9 with a face perpendicular to the optical axis of the semiconductor light-emitting device 4, in the periphery of the front face of the lens portion 15a. A recess 7 is provided in part of the front face of the lens portion 15a at the inner side of the annular flat portion 9. A convex lens portion 8 whose optical axis coincides with that of the semiconductor light-emitting device 4 and concentrating light emitted from the semiconductor light-emitting device 4 in a given field at the front side is provided at the inner side of the recess 7.

The front end of the convex lens portion 8 is a circular flat portion 11, which constitutes part of a diffusing part for diffusing light emitted from the semiconductor light-emitting device 4 toward the sides and is perpendicular to the optical axis of the convex lens portion 8. This circular flat portion 11 is flush with the annular flat portion 9.

The circular flat portion 11 is formed to surround the entire periphery of the rectangular semiconductor light-emitting device 4 when viewed from the front. The recess 7 has a recessed curved face 10 connecting the outer edge of the convex lens portion 8 and the inner edge of the annular flat portion 9.

The semiconductor light-emitting device 4 is placed in a position such that light from the semiconductor light-emitting device 4 strikes the curved face 6 of the resin package 5 at an incident angle of 40° or more. The semiconductor light-emitting device 4 is placed in such a position because of the following reason. Since light from the semiconductor light-emitting device 4 needs to be concentrated in the front face of the resin package 5, it is preferable that the light does not diffuse outwardly from the curved face 6 of the resin package 5 but is reflected in total reflection at the curved face 6. In this case, the incident angle necessary for total reflection of light from the resin package 5 varies depending on the refractive index of the material constituting the resin package 5.

In this embodiment, transparent epoxy resin having a refractive index of 1.55 or less is used for the resin package. In this case, the incident angle necessary for total reflection of light from the resin package 5 is 40 degrees or more. If the material constituting the resin package 5 is replaced with another material, only the position of the semiconductor light-emitting device needs to be changed so as to adjust the total reflection angle in accordance with the refractive index of the replacing resin.

Figure 2B:
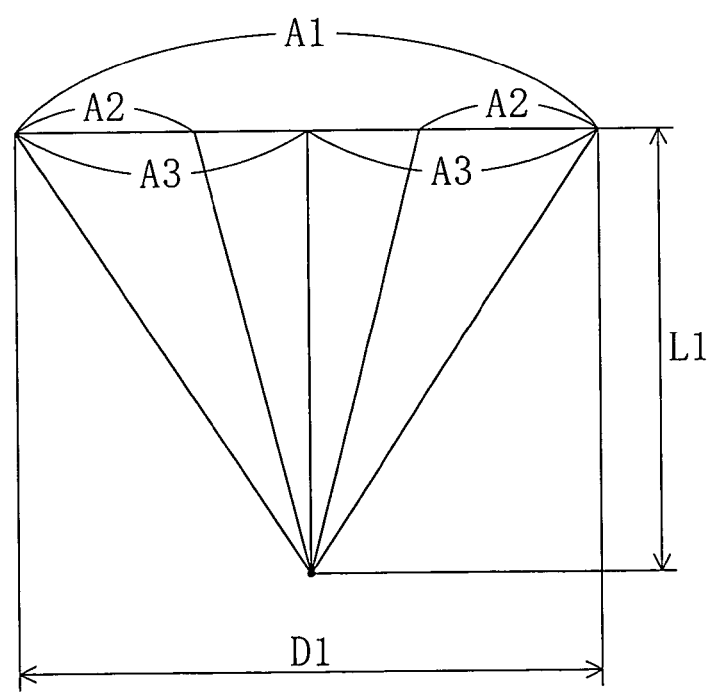

FIGS. 2(A) and 2(B) are illustrations showing optical paths of light emitted from the semiconductor light-emitting device. The recessed curved face 10 is designed in such a shape that does not block light emitted from the convex lens portion 8. In other words, light emitted from the convex lens portion 8 does not strike the recessed curved face 10.

Now, a method for fabricating the light-emitting diode 1 will be described.

Procedures for mounting the semiconductor light-emitting device 4 over the lead frames 2 and 3 are the same as those in a process for fabricating a conventional light-emitting diode, and description thereof will be herein omitted.

A mold for transfer molding is used to form the resin package 5. In this case, a pair of molds movable toward the front and the back of the lead frames 2 and 3 is used, and a mold capable of sliding to both sides is used to form the curved face 6. The use of the sliding mold allows formation even of a configuration in which the curved face 6 projects backward.

Now, the state in which the light-emitting diode 1 is used will be described with reference to FIGS. 2(A) and 2(B) again.

In a case where the light-emitting diode 1 is used as a flash for a camera, it is necessary to uniformly irradiate a circular irradiation field A1 having a diameter D1=about 0.5 m and located at a distance L1=0.5 to 0.6 m from the light-emitting diode 1, as shown in FIG. 2(B), for example.

Light emitted from the semiconductor light-emitting device 4 and incident on the circular flat portion 11 is emitted to the outside of the resin package 5. In this case, the refraction angle is larger than the incident angle on the circular flat portion 11, so that light emitted to the outside from the circular flat portion 11 diffuses radially outward and illuminates the entire irradiation field A1. A spherical concave portion may be formed as a diffusing part, instead of the circular flat portion 11. If a spherical concave portion is formed, the refraction angle increases so that light further diffuses toward the sides.

Light emitted from the semiconductor light-emitting device 4 and incident on the side face of the convex lens portion 8 at the periphery of the circular flat portion 11 is refracted inward along radii so that a peripheral area A2 which is a part of the irradiation field A1 except for a center part thereof is irradiated with the light. The recessed curved face 10 is formed in such a shape that does not allow light emitted outward from the convex lens portion 8 to strike the recessed curved face 10.

Total reflection of light which has been emitted from the semiconductor light-emitting device 4 and reached the curved face 6 occurs, and the reflected light strikes the annular flat portion 9. This light is refracted radially outward at the annular flat portion 9 and is emitted to the outside of the resin package 5. An irradiation area A3 irradiated with light reflected from the curved face 6 is substantially the same as the entire irradiation area A1.

Light emitted from the light-emitting layer of the semiconductor light-emitting device 4 toward the back is reflected from the front face of the lead frame 2 and emitted toward the front. Part of light emitted from the light-emitting layer of the semiconductor light-emitting device 4 obliquely backward strikes a part of the resin package 5 holding the lead frames 2 and 3. However, since the amount of light emitted from the semiconductor light-emitting device obliquely backward is originally small, and thus this light has a small influence on the total amount of light.

Now, advantages obtained by this embodiment will be described.

In this embodiment, the resin package 5 has the contraction portion 17, so that it is unnecessary to reduce the area of the curved face 6 and therefore light emitted toward the sides is concentrated without loss. In addition, the area of the back surface of the resin package 5 is increased by providing the base portion 15b, so that the part supporting the resin package 5 is enlarged to enhance the stability. The base portion 15b projects from the contraction portion 17 in the direction in which the lead frames 2 and 3 project whereas the width of the base portion 15b at the backside is equal to that of the contraction portion 17 at the front side in the direction perpendicular to the direction in which the lead frames 2 and 3 project. In this manner, it is possible to prevent area reduction of the expansion portion 16 except in the direction in which the lead frames 2 and 3 project with the strength against disconnection of the lead frames 2 and 3 to the sides enhanced, so that a high luminance is obtained.

The convex lens portion 8 concentrates light traveling toward the outside of the irradiation field in the irradiation field. The circular flat portion 11 prevents luminance from being partly high in a center part of the irradiation field, so that luminance is uniform in the entire given field. Since the surface of the circular flat portion 11 is flat, light emitted from the semiconductor light-emitting device is refracted at the diffusing part and the light distribution field is enlarged. In addition, the circular flat portion 11 has a simple shape, so that the yield is enhanced. If the convex lens portion 8 does not project from the portion of the front face of the resin package 5 closest to the front, an adsorption jig is kept from contact with the convex lens portion 8 during automatic mounting, so that it is possible to prevent scratches from occurring on the convex lens portion 8 or the light-emitting diode 1 from tilting during adsorption.

The recess 7 releases light which is not concentrated in a given field by the convex lens portion 8 to the outside of the recess 7, so that the area except for the given field is not irradiated with light. The curved face 6 is provided at the side of the resin package 5 so as to cause total reflection of light which is not concentrated in the given field by the convex lens portion 8 and to make the reflected light concentrated in the given field. In this case, the curved face 6 includes an arc using the optical axis of the semiconductor light-emitting device 4 as the center in a lateral cross section, so that light emitted from the semiconductor light-emitting device 4 and incident on the curved face 6 is reflected toward the front over the cross section including the optical axis of the semiconductor light-emitting device 4, and the light is concentrated without loss. Since the curved face is a paraboloid of revolution, a larger amount of light is concentrated.

If the lead frames 2 and 3 are bent into a gull-wing shape and ends of the respective lead frames 2 and 3 project from the both sides of the resin package 5, light emitted from the semiconductor light-emitting device 4 toward the sides and incident on the curved face is reflected toward the front, i.e., in the direction in which principal light of the semiconductor light-emitting device 4 is emitted, so that light emitted toward the sides is concentrated without loss and luminance is enhanced.

The provision of the submount device 18 achieves the following advantage. Since the base portion 15b of the resin package 5 needs to hold the lead frames 2 and 3, so that the base portion 15b cannot be thinner than the necessary thickness. Therefore, the base portion 15b covers the resin package 5 to a given height. In this case, if the semiconductor light-emitting device 4 is directly mounted on the lead frame 2, part of light emitted from the semiconductor light-emitting device 4 toward the sides strikes the base portion 15b. On the other hand, in this embodiment, the semiconductor light-emitting device 4 is mounted on the submount device 18, so that the position of the light-emitting part moves toward the front. Accordingly, the amount of light incident on the base portion 15b is reduced and the amount of light incident on the curved face 6 of the resin package 5 is increased.

The base portion 15b projects in the direction in which the lead frames 2 and 3 project, i.e., projects to the sides. Since the contraction portion 17 is formed between the base portion 15b and the expansion portion 16, the expansion portion 16 does not need to be smaller in accordance with the shape of the base portion 15b. Accordingly, the area of the curved face 6 of the expansion portion 16 does not decrease, so that the amount of light incident on the curved face 6 is increased with the lead frames 2 and 3 held with high strength.

In this embodiment, a phosphor may be printed on the surface of the semiconductor light-emitting device 4. The phosphor is excited by light emitted from the semiconductor light-emitting device 4 and produces a color different from the color of light from the semiconductor light-emitting device 4. For example, if the semiconductor light-emitting device 4 emits blue light, a yellow phosphor is applied so that white light is obtained. The phosphor can be printed to a small thickness uniformly. Accordingly, even if a phosphor is used, the outer shape of the semiconductor light-emitting device 4 does not substantially change. Therefore, even in this case, the semiconductor light-emitting device 4 can be assumed as a point light source, and thus optical paths can be easily designed.

Embodiment 2

Figure 3A:
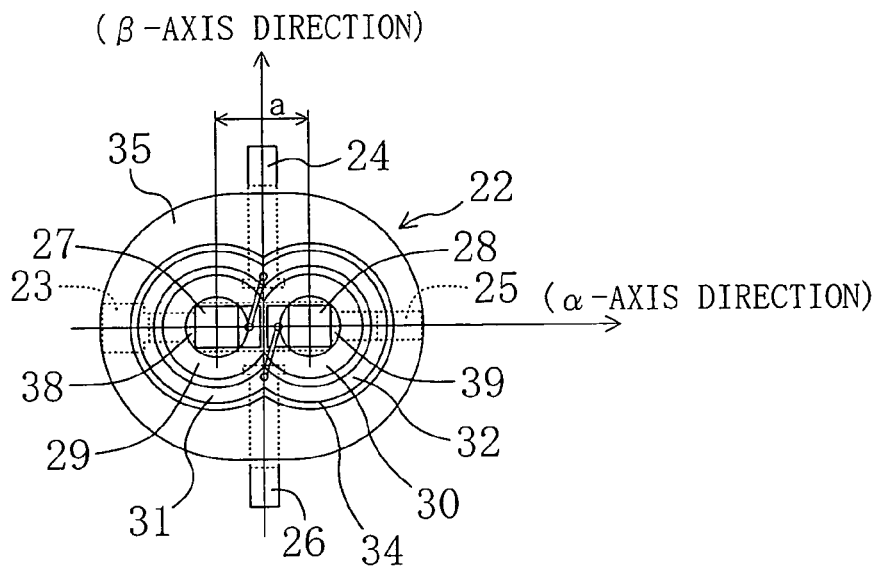
FIG. 3(A) is a plan view showing a light-emitting diode according to a second embodiment.
Figure 3B:
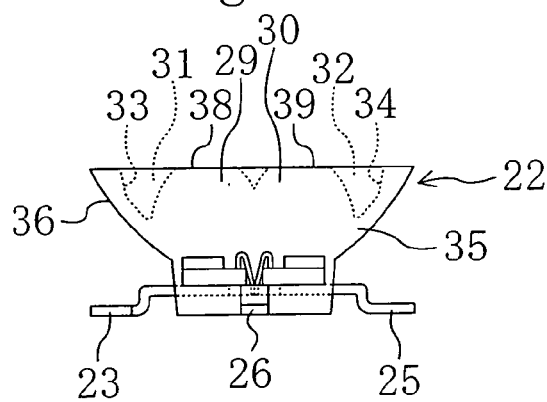
FIG. 3(B) is a side view of the light-emitting diode.
Figure 3C:
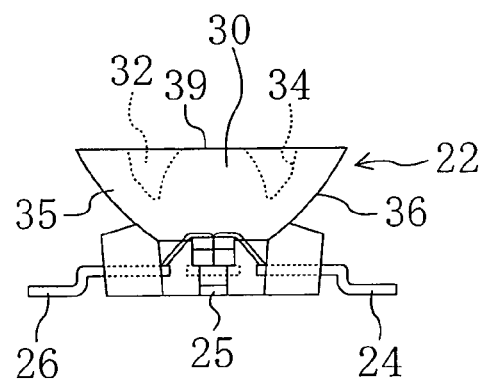
FIG. 3(C) is a front view of the light-emitting diode.
Figure 3D:
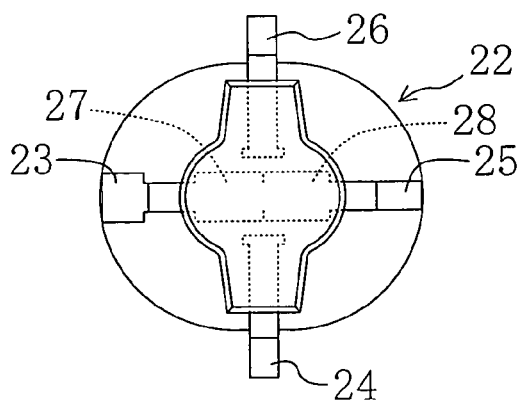
FIG. 3(D) is a bottom view of the light-emitting diode.

FIG. 3(A) is a plan view showing a light-emitting diode according to a second embodiment of the present invention. FIG. 3(B) is a front view of the light-emitting diode. FIG. 3(C) is a side view of the light-emitting diode. FIG. 3(D) is a bottom view of the light-emitting diode.

A light-emitting diode 22 according to the second embodiment is different from the light-emitting diode 1 of the first embodiment in that two semiconductor light-emitting devices and four lead frames are provided.

Lead frames 23, 24, 25 and 26 are formed into gull-wing shapes and are arranged close to each other at an end and form a cross. Two semiconductor light-emitting devices 27 and 28 are respectively mounted over the opposed lead frames 23 and 25 by die bonding. The semiconductor light-emitting device 27 is connected to the lead frame 25 by wire bonding. The semiconductor light-emitting device 28 is connected to the lead frame 26 by wire bonding. The centers of the respective semiconductor light-emitting devices 27 and 28 are spaced at a given distance as shown in FIG. 3(A).

A resin package 35 is an ellipse or a rectangular round in plan view. A curved face 36 at the backside of the resin package 35 is formed by halves of respective paraboloids of revolution using the optical axes of the semiconductor light-emitting devices 27 and 28 as the centers, except for a part of the curved face 36 corresponding to the distance a between the center lines of the respective semiconductor light-emitting devices 27 and 28 shown in FIG. 3(A). The part corresponding to the distance a is a rectangle in a front cross-sectional view.

Convex lens portions 29 and 30 have their optical axes coincide with the optical axes of the semiconductor light-emitting devices 27 and 28, respectively. Since the semiconductor light-emitting devices 27 and 28 are close to each other, parts of the overlapping peripheries of the convex lens portions 29 and 30 are united. Recesses 31 and 32 and recessed curved faces 33 and 34 are formed around the convex lens portions 29 and 30. The recesses 31 and 32 overlap with each other and the recessed curved faces 33 and 34 overlap with each other. The recesses 31 and 32 and the recessed curved faces 33 and 34 are formed into rings each formed by connecting two arcs together.

Circular flat portions 38 and 39 located at the inner side of the respective convex lens portions 29 and 30 are spaced.

Light emitted from light-emitting layers of the semiconductor light-emitting devices 27 and 28 toward the sides is reflected from the curved face 36 and emitted toward the front. Light emitted from the light-emitting layers of the semiconductor light-emitting devices 27 and 28 to the side faces of the convex lens portions 29 and 30 are refracted radially inward at the surfaces of the convex lens portions 29 and 30 and concentrated. Light emitted from the light-emitting layers of the semiconductor light-emitting devices 27 and 28 toward the circular flat portions 38 and 39 is refracted and diffused radially outward with respect to the circular flat portions 38 and 39 and emitted to the outside of the circular flat portions 38 and 39.

When current flows in the lead frames 23 and 24 of the light-emitting diode 22, the semiconductor light-emitting device 27 emits light. When current flows in the lead frames 25 and 26, the semiconductor light-emitting device 28 emits light. It is possible to make the semiconductor light-emitting devices 27 and 28 emit light at the same time. The semiconductor light-emitting devices 27 and 28 can emit light of two different colors. In such a case, these colors are produced separately or a mixture of these two colors is produced.

Figure 4A:
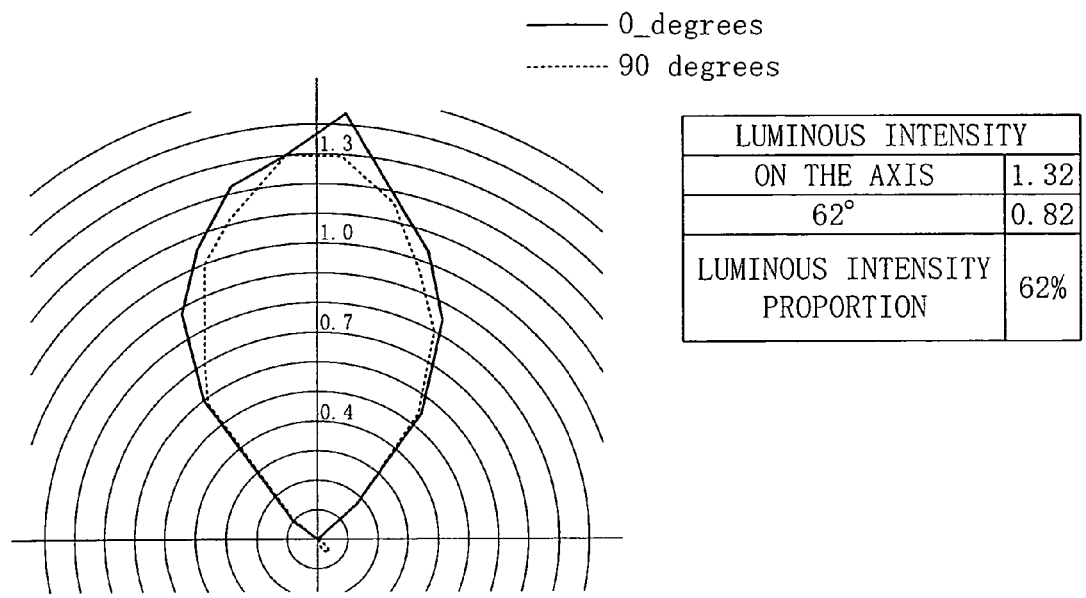
FIG. 4(A) is a graph showing a light distribution characteristic of the light-emitting diode of the second embodiment.
Figure 4B:
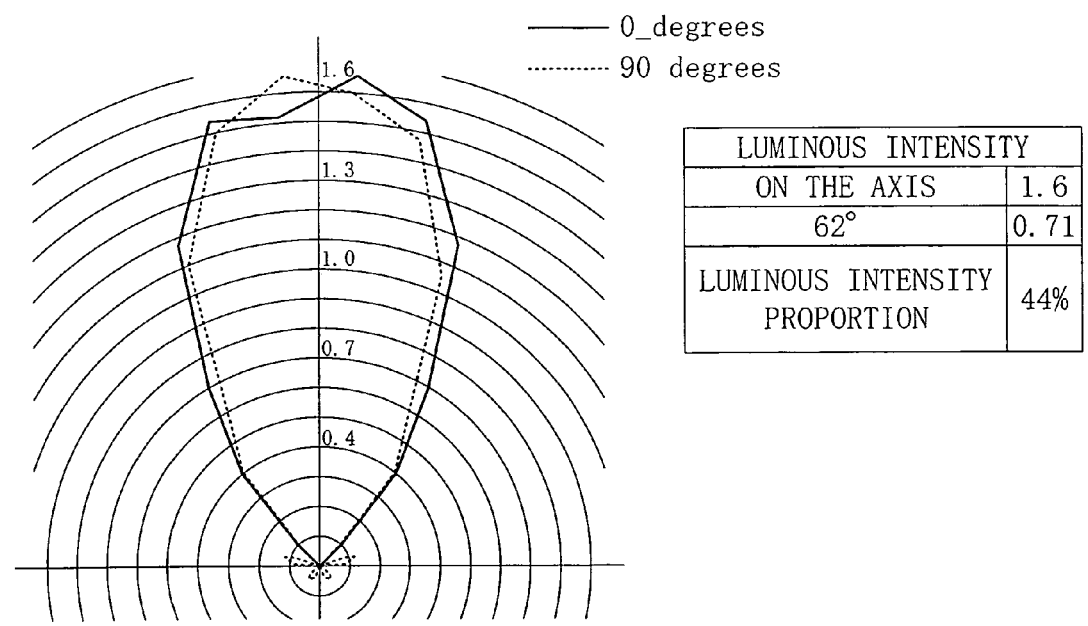
FIG. 4(B) is a graph showing a light distribution characteristic of a conventional light-emitting diode.

Now, a light distribution characteristic of the light-emitting diode of this embodiment will be described with reference to drawings. FIG. 4(A) is a graph showing a light distribution characteristic of the light-emitting diode of this embodiment. FIG. 4(B) is a graph showing a light distribution characteristic of a conventional light-emitting diode.

As the conventional light-emitting diode, a light-emitting diode in which the upper part of a convex lens portion of a resin package was spherical was used. Simulations were performed for cases where two light-emitting diodes operate in the same electrical conditions.

In FIGS. 4(A) and 4(B), the distance from the origin indicates the luminous intensity and the angle with respect to the Y axis (optical axis) indicates the light distribution angle. In the graphs, for light distribution characteristics indicated by the solid lines, the angle with respect to the Y axis (optical axis) is a tilt angle with respect to the optical axis in the α-axis direction (shown in FIG. 3(A)). For light distribution characteristics indicated by the broken lines, the angle with respect to the Y axis (optical axis) is a tilt angle with respect to the optical axis in the β-axis direction.

To irradiate a square region measuring 50 cm per side at a distance of 60 cm from a light-emitting diode along its optical axis, a light diffusion angle of 62° or more (a tilt angle of 31° with respect to the Y axis) is needed. In view of this, luminous intensities on the axes for the respective light-emitting diodes were compared and luminous intensities in the direction at a light diffusion angle of 62° were also compared.

The comparison on the axes shows that the luminous intensity of the conventional device is 1.6 whereas the luminous intensity of the device of this embodiment is 1.32. This shows that the luminance decreases in a center part of a light-emission area in the device of this embodiment. On the other hand, with respect to the direction at a light diffusion angle of 62°, the luminous intensity is 0.71 in the conventional device and is 0.82 in the device of this embodiment. As a result, the luminous intensity proportion is 44% in the conventional example and is 62% in this embodiment. Accordingly, it is shown that the light distribution area is enlarged and a given field is uniformly irradiated with light in this embodiment.

Embodiment 3

In a third embodiment, though not shown, a light-emitting diode in which three semiconductor light-emitting devices are mounted over lead frames will be described. The light-emitting diode according to this embodiment uses semiconductor light-emitting devices emitting red light, green light and blue light, respectively. Each of the semiconductor light-emitting devices can produce one of red, green and blue, a mixture of two of these colors, or a mixture of these three colors. White light can also be produced by adjusting the luminances of the three colors.

In this embodiment, a circular flat portion is formed on each convex lens portion to diffuse light, so that the luminances of the colors are made uniform and the colors are uniformly mixed.

White light obtained from blue light by using a yellow phosphor has a small amount of red component. Accordingly, if such white light is used by a flash for taking pictures, white light different from natural light is generated. However, if three colors are mixed in this case, white light close to natural light is obtained.

If three or more semiconductor white-light-emitting devices (e.g., light-emitting devices obtained by coating blue LEDs with phosphors) are used, a high-power light-emitting diode is obtained. This light-emitting diode emits light with a luminance enough to be used by flashes for digital cameras.

Embodiment 4

Figure 5A:
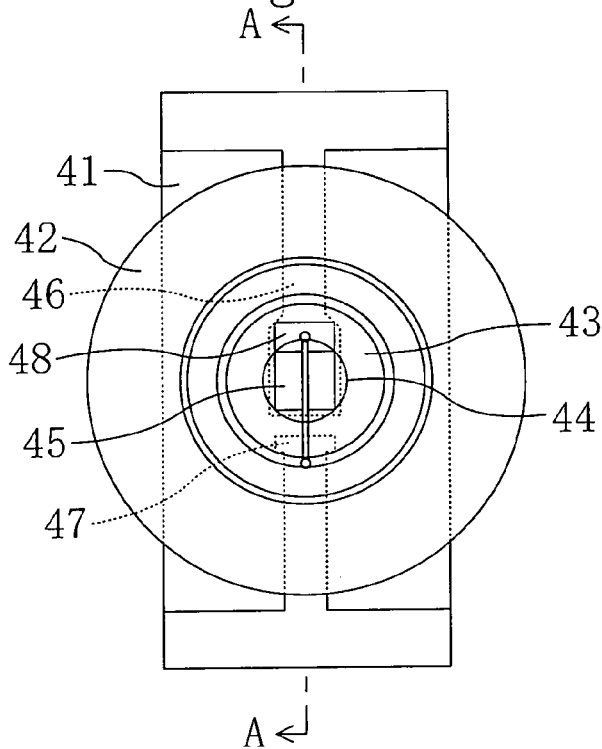
FIG. 5(A) is a plan view showing a light-emitting diode according to a fourth embodiment.
Figure 5B:
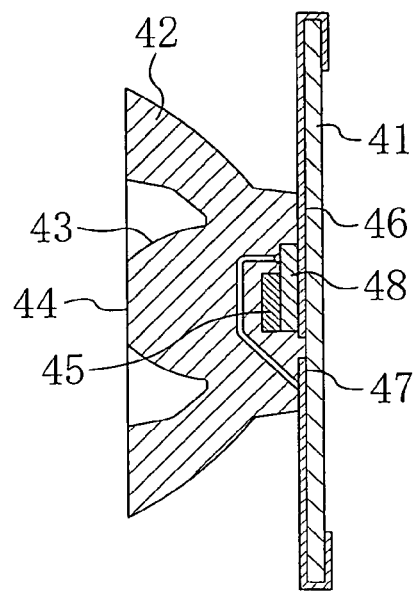
FIG. 5(B) is a cross-sectional view taken along line A-A in the light-emitting diode.

FIG. 5(A) is a plan view showing a light-emitting diode according to a fourth embodiment. FIG. 5(B) is a cross-sectional view taken along line A-A in the light-emitting diode.

The semiconductor light-emitting device of the fourth embodiment uses a printed wiring board 41, instead of the lead frames 2 and 3 used in the light-emitting diode 1 of the first embodiment. A resin package 42 has a circular flat portion 44 located at the inner side of a convex lens portion 43. Light emitted from a semiconductor light-emitting device 45 is concentrated in the convex lens portion 43 and diffused by the circular flat portion 44, so that luminance is uniformly enhanced.

The semiconductor light-emitting device 45 is connected, by die bonding, to a submount device 48 on an electrode pattern 46 formed on the printed wiring board 41 and is also electrically connected, by wire bonding, to an electrode pattern 47 formed on the printed wiring board 41. The use of the printed wiring board 41 prevents light from leaking to the backside of the printed wiring board 41. The electrode patterns 46 and 47 are obtained by applying a Ni/Au coating to the surface of an etching pattern made of Cu. This process ensures both wire bonding and reflow soldering during surface mounting.

Figure 6A:
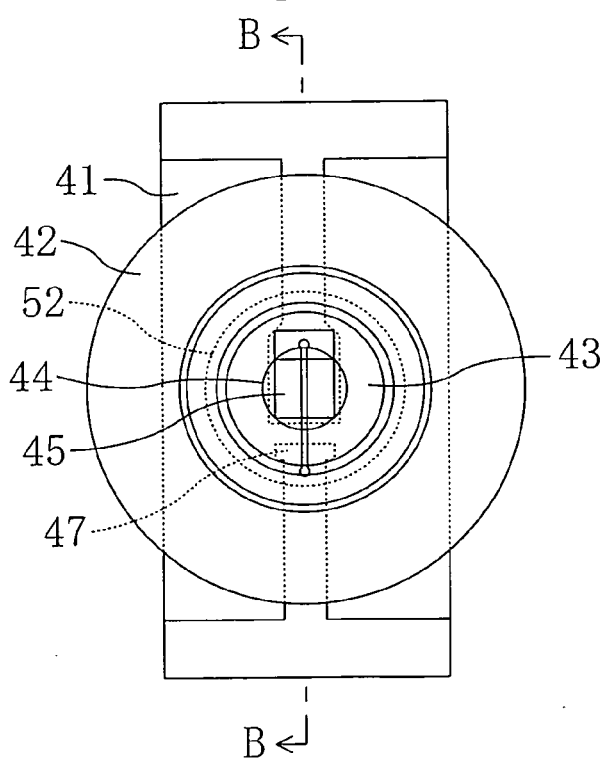
FIG. 6(A) is a plan view showing a light-emitting diode according to a modified example of the fourth embodiment.
Figure 6B:
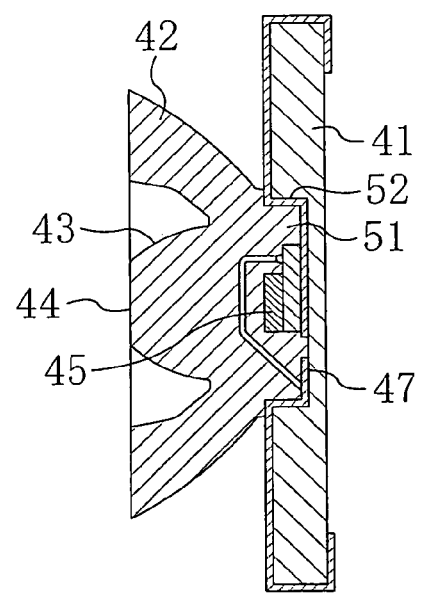
FIG. 6(B) is a cross-sectional view taken along line B-B in the light-emitting diode.

FIG. 6(A) is a plan view showing a light-emitting diode according to a modified example of the fourth embodiment. FIG. 6(B) is a cross-sectional view taken along line B-B in the light-emitting diode. In the light-emitting diode shown in FIG. 6, a recess 51 is formed in the surface of the printed wiring board 41 of the light-emitting diode shown in FIG. 5. The recess 51 does not penetrate the printed wiring board 41. A reflective face is formed on the bottom and a side 52 of the recess 51 by plating. The semiconductor light-emitting device 45 mounted at the bottom of the recess 51 is electrically connected to the electrode pattern 47 by wire bonding. All the light emitted from the semiconductor light-emitting device 45 obliquely backward is reflected from the bottom and the side 52 of the recess 51 and is emitted from the resin package 42 toward the front. Accordingly, luminance is further enhanced. The resin package 42 has the circular flat portion 44 located within the convex lens portion 43 and light emitted from the semiconductor light-emitting device 45 is concentrated by the convex lens portion 43 and is diffused from the circular flat portion 44. Accordingly, luminance is enhanced uniformly.

In this embodiment, with the use of the printed wiring board 41, light emitted from the semiconductor light-emitting device 45 backward is reflected to the front, thus preventing leakage of light toward the back. If the semiconductor light-emitting device 45 is mounted in the recess 51 formed in the printed wiring board 41, all the light emitted toward the back and obliquely toward the back of the semiconductor light-emitting device 45 is reflected so that the luminance on the front face in the optical axis direction is enhanced.

Embodiment 5

Figure 7A:
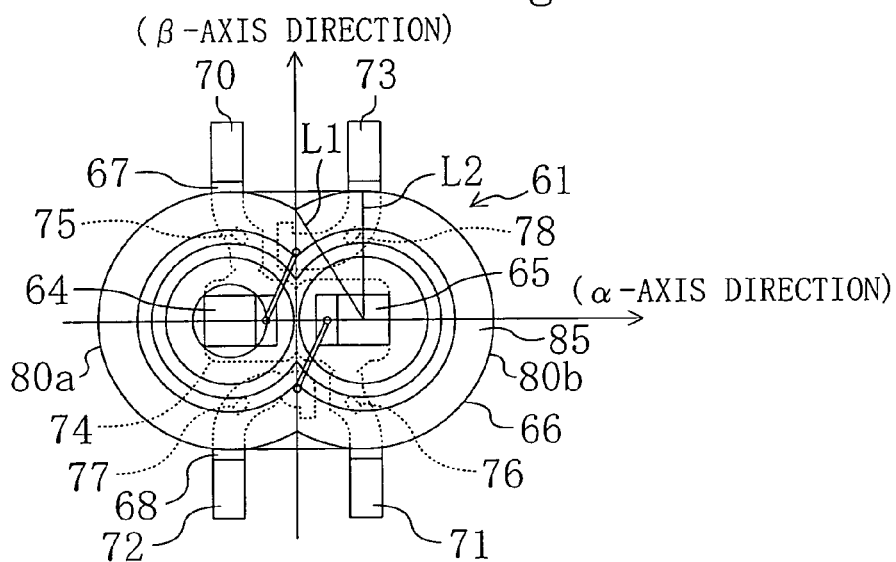
FIG. 7(A) is a plan view showing a light-emitting diode according to a fifth embodiment of the present invention.
Figure 7B:
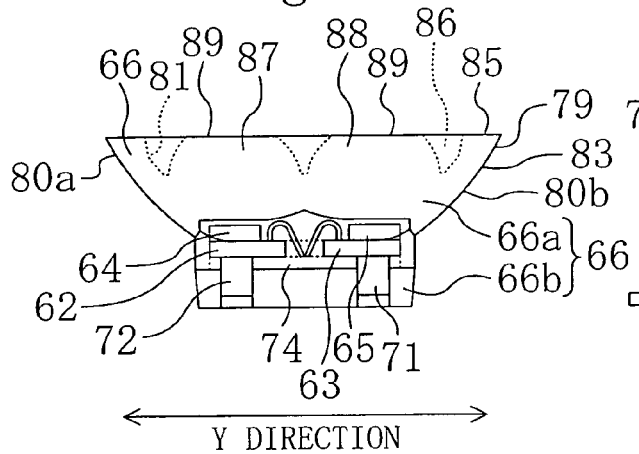
FIG. 7(B) is a side view of the light-emitting diode.
Figure 7C:
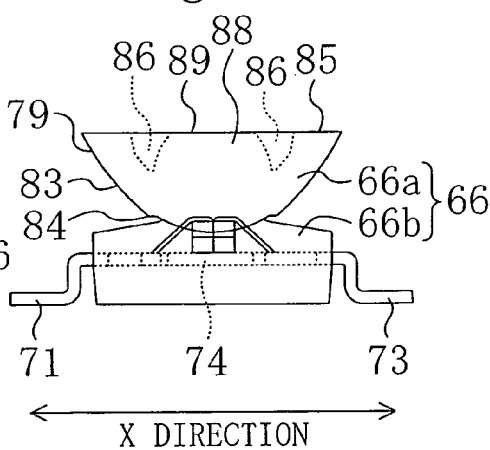
FIG. 7(C) is a front view of the light-emitting diode.
Figure 7D:
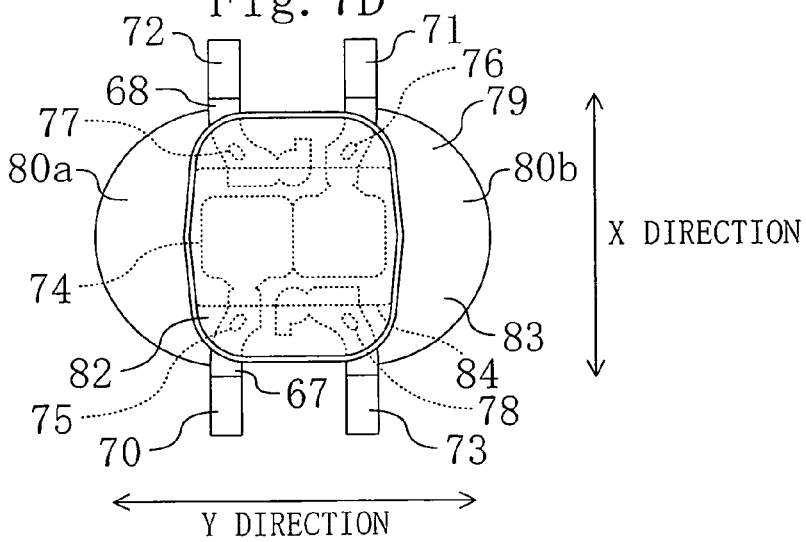
FIG. 7(D) is a bottom view of the light-emitting diode.

FIG. 7(A) is a plan view showing a light-emitting diode according to a fifth embodiment of the present invention. FIG. 7(B) is a front view of the light-emitting diode. FIG. 7(C) is a side view of the light-emitting diode. FIG. 7(D) is a bottom view of the light-emitting diode.

As shown in FIG. 7, a light-emitting diode 61 includes: semiconductor light-emitting devices 64 and 65 emitting light of the same color and mounted over base portions of lead frames (i.e., a first frame 67 and a second frame 68) with submount devices 62 and 63 sandwiched therebetween; and a transparent resin package 66 covering the semiconductor light-emitting devices 64 and 65.

The first frame 67 is integrally formed out of a plate obtained by, for example, applying a Ni/Ag coating to a Cu alloy or others. The second frame 68 is integrally formed out of the plate obtained by, for example, applying the Ni/Ag coating to the Cu alloy or others.

As shown in FIG. 7(D), in the first frame 67, a device fixing part 74 which is rectangular in plan view is placed such that the longitudinal direction thereof extends along the direction (Y direction) perpendicular to the X direction. A pair of terminals 70 and 71 projecting from the resin package 66 is provided at both sides (toward the sides) of the device fixing part 74 in the X direction. The terminals 70 and 71 are continuous via the device fixing part 74.

Each of the base parts of the terminals 70 and 71 is covered with the resin package and slightly bends toward the center of the device fixing part 74. Long holes 75 and 76 are provided in the respective bend portions.

On the other hand, the second frame 68 is provided with a pair of terminals 72 and 73 projecting from both sides of the resin package 66 in the X direction (i.e., toward the sides). The terminals 72 and 73 are apart from each other with the device fixing part 74 of the first frame 67 sandwiched therebetween. The terminals 72 and 73 of the second frame 68 bend such that the base ends of the terminals 72 and 73 are located near the device fixing part 74 and the base parts of the terminals 70 and 71, in regions covered with the resin package 66. Long holes 77 and 78 are formed in these bend portions. Head parts of the respective terminals 72 and 73 are parallel to head parts of the respective terminals 70 and 71.

Since the base parts of the terminals 70 and 71 and the terminals 72 and 73 bend, so that these terminals are not removed readily from the resin package 66 when being pulled to the sides. In addition, since the long holes 75, 76, 77 and 78 are formed, the terminals 70 and 71 and the terminals 72 and 73 do not readily rotate. When force is applied, the terminals 70 and 71 and the terminals 72 and 73 bend near the long holes 75, 76, 77 and 78. Accordingly, it is possible to prevent bending of base parts of the terminals 70 and 71 and the terminals 72 and 73 by application of force. It is also possible to maintain the strength in die bonding and wire bonding.

As shown in FIG. 7(C), the terminals 70 and 71 and the terminals 72 and 73 bend into gull-wing shapes. More specifically, the terminals 70 and 71 and the terminals 72 and 73, extend from the base parts on which the semiconductor light-emitting devices 64 and 65 are mounted, project from both sides of the resin package 66 in the X direction, and bend backward and then outward to extend to the sides in the X direction.

The terminals 70 and 71 or the terminals 72 and 73 are point symmetric with respect to the center of the resin package 66.

The submount devices 62 and 63 are connected to the device fixing part 74 of the first frame 67 by die bonding and also connected to the second frame 68 by wire bonding. The wire bonding portions of the submount devices 62 and 63 are located close to each other. The semiconductor light-emitting devices 64 and 65 are apart from each other on the submount devices 62 and 63, respectively, at both sides in the Y direction. That is, the semiconductor light-emitting devices 64 and 65 are disposed in the direction (Y direction) perpendicular to the direction (X direction) in which the terminals 70 and 71 and the terminals 72 and 73 project.

Since the wire bonding portions of the submount devices 62 and 63 are close to each other, wiring is placed substantially at the center of the resin package 66. Accordingly, the wiring is not readily deformed and broken by external forces.

The pair of terminals 70 and 71 of the first frame 67 is connected to p-electrodes (not shown) of the semiconductor light-emitting devices 64 and 65. The pair of terminals 72 and 73 of the second frame 68 is connected to n-electrodes (not shown) of the semiconductor light-emitting devices 64 and 65. In this configuration, even if a voltage is applied with the light-emitting diode 61 rotated 180° on a circuit board (not shown), no reverse current flows in the light-emitting diode 61. That is, even in such a case, the light-emitting diode 61 emits light in the same way as in a case where the light-emitting diode 61 is not rotated.

In this embodiment, the front side is the face of a lead frame to which the semiconductor light-emitting device 4 is connected and also is the principal-light-emitting surface of the semiconductor light-emitting device 64.

The resin package 66 is made of a resin such as transparent epoxy resin and includes: a lens portion 66a at the front side; and a base portion 66b at the backside, as shown in FIGS. 7(B) and 7(C). The base portion 66b is formed at the back of the semiconductor light-emitting devices 64 and 65, covers the base parts of the terminals 70 and 71 and the terminals 72 and 73 and extends to the sides. The base portion 66b is cylindrical on the back faces of the semiconductor light-emitting devices 64 and 65 and also projects from the sides of the cylinder in the X direction in which the terminals 70 and 71 and the terminals 72 and 73 project. In other words, the base portion 66b includes a cylindrical part for holding the semiconductor light-emitting devices 64 and 65 and rectangular solids located on the sides of the cylindrical part and supporting the base parts of the terminals 70 and 71 and the terminals 72 and 73.

The back face of the base portion 66b is substantially flush with the back faces of the outer end parts of the terminals 70 and 71 and terminals 72 and 73. The expression "substantially flash with" includes a case where the back faces of the terminals 70 and 71 and terminals 72 and 73 are at a level slightly higher than the back face of the base portion 66b. It is assumed that if the terminals 70 and 71 and the terminals 72 and 73 are in contact with solder applied to a circuit board with the back face of the base portion 66b of the light-emitting diode 61 being in contact with the circuit board, the back face of the base portion 66b is substantially flush with the back faces of the outer end parts of the terminals 70 and 71 and the terminals 72 and 73.

On the other hand, the lens portion 66a includes: an expansion portion 83 having a curved face 79 which gradually expands toward the front so as to cause total reflection of light emitted from the semiconductor light-emitting devices 64 and 65 toward the sides and to make the reflected light released toward the front; and a contraction portion 84 located between the expansion portion 83 and the base portion 66b. As shown in FIGS. 7(B) and 7(C), both ends of the expansion portion 83 in the Y direction are lower than they are in the X direction.

The curved face 79 of the expansion portion 83 extends backward from the front face of the resin package 66. The curved face 79 connects paraboloids of revolution 80a and 80b (shown in FIG. 7(B)) whose respective centers are located on the optical axes of the semiconductor light-emitting devices 64 and 65. That is, the curved face 79 connects arcs formed by using the optical axes of the semiconductor light-emitting devices 64 and 65 as the centers in a lateral cross section. The paraboloids of revolution 80a and 80b are designed such that light emitted from the semiconductor light-emitting devices 64 and 65 strikes the curved face 79 at an incident angle of 40° or more. The incident angle is set at 40° or more because the total reflection angle is 40° when the refractive index of the resin package is 1.55. In this manner, most of the light incident on the curved face 79 is totally reflected and emitted toward the front in the optical axis direction. If the material for the resin is changed, the position of the semiconductor light-emitting devices and the shape of the package can be changed in accordance with the total reflection angle.

In the resin package 66, an annular flat portion 85 having a face perpendicular to the optical axes of the semiconductor light-emitting devices 64 and 65 is provided in the periphery of the front face of the lens portion 66a. A recess 86 is provided at the inner side of the annular flat portion 85 in the front face of the lens portion 66a. The recess 86 has an outer shape connecting arcs concentric with the respective paraboloids of revolution 80a and 80b in plan view. Convex lens portions 87 and 88 having a shape connecting arcs concentric with the recess 86 in a lateral cross section is formed at the inner side of the recess 86.

The front ends of the respective convex lens portions 87 and 88 form a circular flat portion 89. This circular flat portion 89 is flush with the annular flat portion 85. The recess 86 includes a recessed curved face 81 connecting the outer edges of the convex lens portions 87 and 88 and the inner edge of the annular flat portion 85.

In this manner, the light-emitting diode 61 is configured to be of a surface mounting type.

Now, a method for fabricating the light-emitting diode 61 will be described.

First, a plate is subjected to punching so that a plate member for forming the first and second frames 67 and 68 is formed. The outer edges of parts of this plate member to be the first frame 67 and the second frame 68 are partially connected to the other part. This state is maintained until the first frame 67 and the second frame 68 are bent into a gull-wing shape. Thereafter, the semiconductor light-emitting devices 64 and 65 are mounted on the first frame 67.

On the other hand, to form the resin package 66, a mold for transfer molding is used. In this case, a pair of molds movable toward the front and the back of the first frame 67 and the second frame 68 is used and a mold capable of sliding to both sides (in the X direction) along which the first frame 67 and the second frame 68 project is used to form the curved face 79. The use of the sliding mold allows even formation of a configuration in which the contraction portion 84 is provided.

Figure 8:
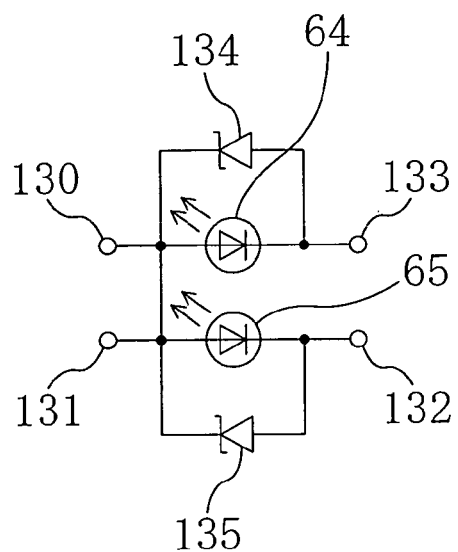
FIG. 8 is a circuit diagram showing a configuration of a light-emitting diode 61.

Now, the state in which the light-emitting diode 61 is used will be described with reference to drawings FIG. 8 is a circuit diagram showing a configuration of the light-emitting diode 61. As shown in FIG. 8, Zener diodes 134 and 135 formed for the semiconductor light-emitting devices 64 and 65 are connected to the respective semiconductor light-emitting devices 64 and 65 with their polarities opposite to those of the semiconductor light-emitting devices 64 and 65.

As shown in FIG. 8, to make the light-emitting diode emit light, a voltage is applied such that a terminal 130 connected to a p-electrode of the semiconductor light-emitting device 64 is positive and a terminal 133 connected to an n-electrode of the semiconductor light-emitting device 64 is negative. A voltage is also applied such that a terminal 131 connected to a p-electrode of the semiconductor light-emitting device 65 is positive and a terminal 132 connected to an n-electrode of the semiconductor light-emitting device 65 is negative.

If the light-emitting diode 61 is rotated 180° with respect to the state shown in FIG. 7(A), the positions of the terminal 130 and the terminal 131 are replaced with each other and the positions of the terminal 132 and the terminal 133 are replaced with each other. However, even in this state, a voltage is applied such that the terminals 130 and 131 are positive and the terminals 132 and 133 are negative. Accordingly, in a case where the semiconductor light-emitting devices 64 and 65 are designed to produce the same color, even if the light-emitting diode 61 is mounted in the reversed orientation, light is emitted in the same way.

For a light-emitting diode, the shape of leads of a product needs to be changed and a mark needs to be added to a resin package in order to make the polarities uniform in general. For shipment or use of a light-emitting diode, polarity needs to be checked. However, even if the light-emitting diode of this embodiment is rotated 180° and mounted, the diode can be used in the same manner as in a case where the diode is not rotated. Accordingly, polarity does not need to be considered in this case. The polarity does not need to be checked during fabrication and application, either. As a result, the product is easily handled.

The terminals 70 and 71 of the first frame 67 are continuous and the terminals 72 and 73 of the second frame 68 are spaced, so that the strength of lead frames increases and strength against disconnection is enhanced.

The head parts of the terminals 70 and 71 of the first frame 67 are parallel to the head parts of the terminals 72 and 73 of the second frame 68 and the semiconductor light-emitting devices 64 and 65 are disposed in the direction perpendicular to the head parts of the terminals 70 and 71 of the first frame 67 and the head parts of the terminals 72 and 73 of the second frame 68, thereby fabricating a light-emitting diode of a surface mounting type. In addition, the distance between terminals is adjusted in accordance with the distance between the semiconductor light-emitting devices 64 and 65, so that the product is made thin and can be miniaturized.

The first frame 67 has the device fixing part 74 for fixing the back faces of the semiconductor light-emitting devices 64 and 65. The terminals 70 and 71 of the first frame 67 project from both sides of the device fixing part 74 in opposite directions perpendicularly to the longitudinal direction of the device fixing part 74. The terminals 72 and 73 of the second frame 68 have their base parts located near the device fixing part 74 and their head parts located in parallel to the terminals 70 and 72 of the first frame 67. In this case, the terminals are not readily removed from the resin package and a break in wiring is prevented, thus enhancing the reliability of the product.

If the base part of each of the terminals 72 and 73 of the second frame 68 bends toward the adjacent one of the terminals 70 and 71 of the first frame 67 inside the resin package 66, the terminals 72 and 73 are not readily removed from the resin package 66, thus enhancing the reliability of the product.

The light-emitting diode 61 includes the submount devices 62 and 63. Accordingly, if an excessive voltage or a reverse voltage is applied to the light-emitting diode 61 by mistake, the Zener diodes 134 and 135 provided on the submount devices 62 and 63 prevent high current from flowing in the light-emitting diode 61, so that the reliability of the product is enhanced.

Figure 9:
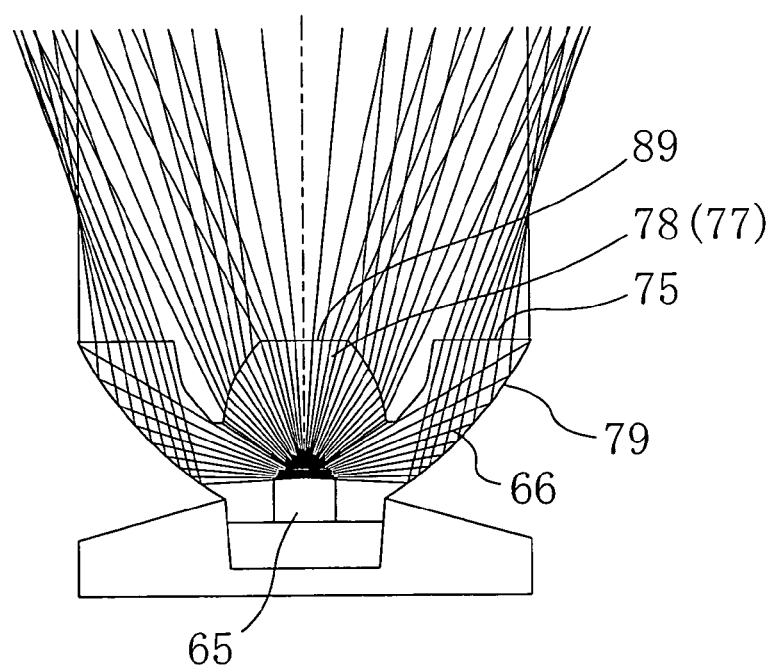
FIG. 9 is an illustration showing optical paths of light emitted from a semiconductor light-emitting device.

FIG. 9 is an illustration showing optical paths of light emitted from the semiconductor light-emitting device. As shown in FIG. 9, light emitted from the semiconductor light-emitting devices 64 and 65 and incident on the circular flat portion 89 is refracted at the front face of the circular flat portion 89 and diffused outward. Light incident on the faces of convex lens portions 87 and 88 surrounding the circular flat portion 89 is refracted toward the optical axes. Total reflection of light which has reached the curved face 79 from the semiconductor light-emitting devices 64 and 65 occurs, and the reflected light is released toward the optical axes. Light emitted from light-emitting layers of the semiconductor light-emitting devices 64 and 65 backward is reflected from the front faces of the first frame 67 and the second frame 68 and emitted toward the front.

As shown in FIG. 7, the light-emitting diode 61 has the same cross-sectional shape as shown in FIG. 9 both when taken along the line L1 connecting the intersection point of arcs of paraboloids of revolution 80*a* and 80*b* in plan view and the optical axis of the semiconductor light-emitting device 65 and when taken along the line L2 drawn from the optical axis of the semiconductor light-emitting device 65 in the X direction. The fact that the cross-sectional shape is unchanged as described above provides the following advantages.

For example, if a lateral cross section of the resin package 66 is a rectangular round, i.e., the lateral cross section is of a shape formed by forming the paraboloids of revolution 80*a* and 80*b* into semicircles in plan view and connecting associated ends of the respective semicircles by straight lines, light emitted from the semiconductor light-emitting device 65 along the line L2 is reflected along a plane including the line L2 and the optical axis of the semiconductor light-emitting device 65 whereas light emitted from the semiconductor light-emitting device 65 along the line L1 is reflected toward the semiconductor light-emitting device 64 with respect to a plane including the line L1 and the optical axis of the semiconductor light-emitting device 65. This phenomenon is common to all the light beams emitted between the line L2 and the line L1. One light-emitting diode 61 has four regions similar to the region between the line L2 and the line L1. Therefore, the luminance of the light-emitting diode 61 greatly decreases.

On the other hand, in this embodiment, the curved face 79 is formed to connect arcs respectively using the optical axes of the semiconductor light-emitting devices 64 and 65 as the centers in a lateral cross section, so that light beams emitted between the line L1 and the line L2 are emitted along planes including the semiconductor light-emitting device 65. Accordingly, luminance is enhanced and reflected light is uniformly diffused.

The recess 86 also has a shape connecting arcs in the same manner as the curved face 79. Accordingly, the distance between the curved face 79 and the recess 86 is kept constant to further ensure that light reflected from the curved face 79 reaches the annular flat portion 85.

In this manner, in this embodiment, almost all the light beams emitted from the semiconductor light-emitting devices 64 and 65 are released in parallel toward the front in the optical axis direction. Part of light emitted from the light-emitting layers of the semiconductor light-emitting devices 64 and 65 obliquely backward strikes a part supporting the first frame 67 holding the first frame 67 and the second frame 68. However, since the amount of light emitted from the semiconductor light-emitting devices obliquely backward is originally small, this light has a small influence on the total amount of light.

Figure 10A:
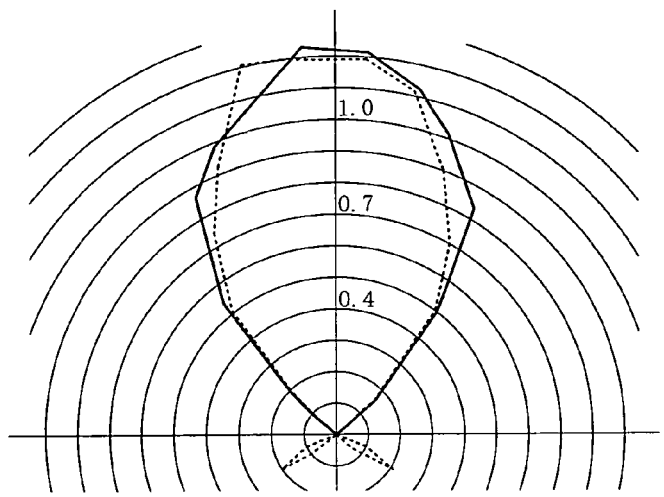
FIG. 10(A) is a graph showing a light distribution characteristic of the light-emitting diode of the fifth embodiment of the present invention.
Figure 10B:
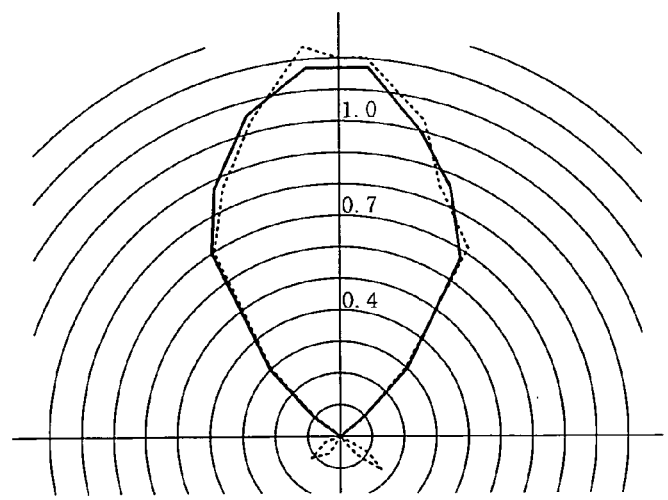
FIG. 10(B) is a graph showing a light distribution characteristic of a light-emitting diode according to a comparative example.

Now, a light distribution characteristic of the light-emitting diode of this embodiment will be described with reference to drawings. FIG. 10(A) is a graph showing a light distribution characteristic of the light-emitting diode of the fifth embodiment of the present invention. FIG. 10(B) is a graph showing a light distribution characteristic of a light-emitting diode according to a comparative example.

As the light-emitting diode of the comparative example, used was a light-emitting diode having a resin package 66 in the shape of a rectangular round in a lateral cross section, i.e., a shape obtained by forming paraboloids of revolution 80*a* and 80*b* into semicircles in a lateral cross section and connecting associated ends of the respective semicircles by straight lines. Then, simulations were performed for cases where these two light-emitting diodes operate in the same electrical conditions.

In FIGS. 10(A) and 10(B), the distance from the origin indicates the luminous intensity and the angle with respect to the Y axis (optical axis) indicates the light distribution angle. In the drawings, for light distribution characteristics indicated by the solid lines, the angle with respect to the Y axis is a tilt angle with respect to the optical axis in the α-axis direction. For light distribution characteristics indicated by the broken lines, the angle with respect to the Y axis is a tilt angle with respect to the optical axis in the β-axis direction.

To irradiate a square region measuring 50 cm per side at a distance of 60 cm from a light-emitting diode along its optical axis, a light diffusion angle of 62° or more is needed. In view of this, luminous intensities on the axes of the respective light-emitting diodes were compared and luminous intensities in the direction at a light diffusion angle of 62° were also compared.

The comparison on the axes shows that the luminous intensity of the device of the comparative example is 1.18 whereas the luminous intensity of the device of this embodiment is 1.21. This shows that the luminous intensity increases about 2.5% in the device of this embodiment. With respect to the direction at a light diffusion angle of 62°, the luminous intensity is 0.72 in the device of the comparative example and is 0.78 in the device of this embodiment. This shows that the luminous intensity increases about 8% in the device of this embodiment. In this way, the luminance is enhanced especially in an area apart from the optical axis. The luminous intensity proportion is 61% in the comparative example and is 64% in this embodiment. Accordingly, the light distribution area is enlarged and a given field is uniformly irradiated with light in this embodiment.

The present invention is not limited to the foregoing embodiments and is also applicable to cases where the resin package is a rectangular solid, or a convex lens is formed on the front side of a rectangular base. If the polarity of the submount devices (Zener diodes) in use is changed, it is possible to make the first frame serve as an n-electrode and the second frame as a p-electrode.

A plurality of first frames and a plurality of second frames may be provided. Then, the present invention is applicable to a case where three or more semiconductor light-emitting devices are used.

Embodiment 6

Figures 11A, 11B, 12A, 12B:
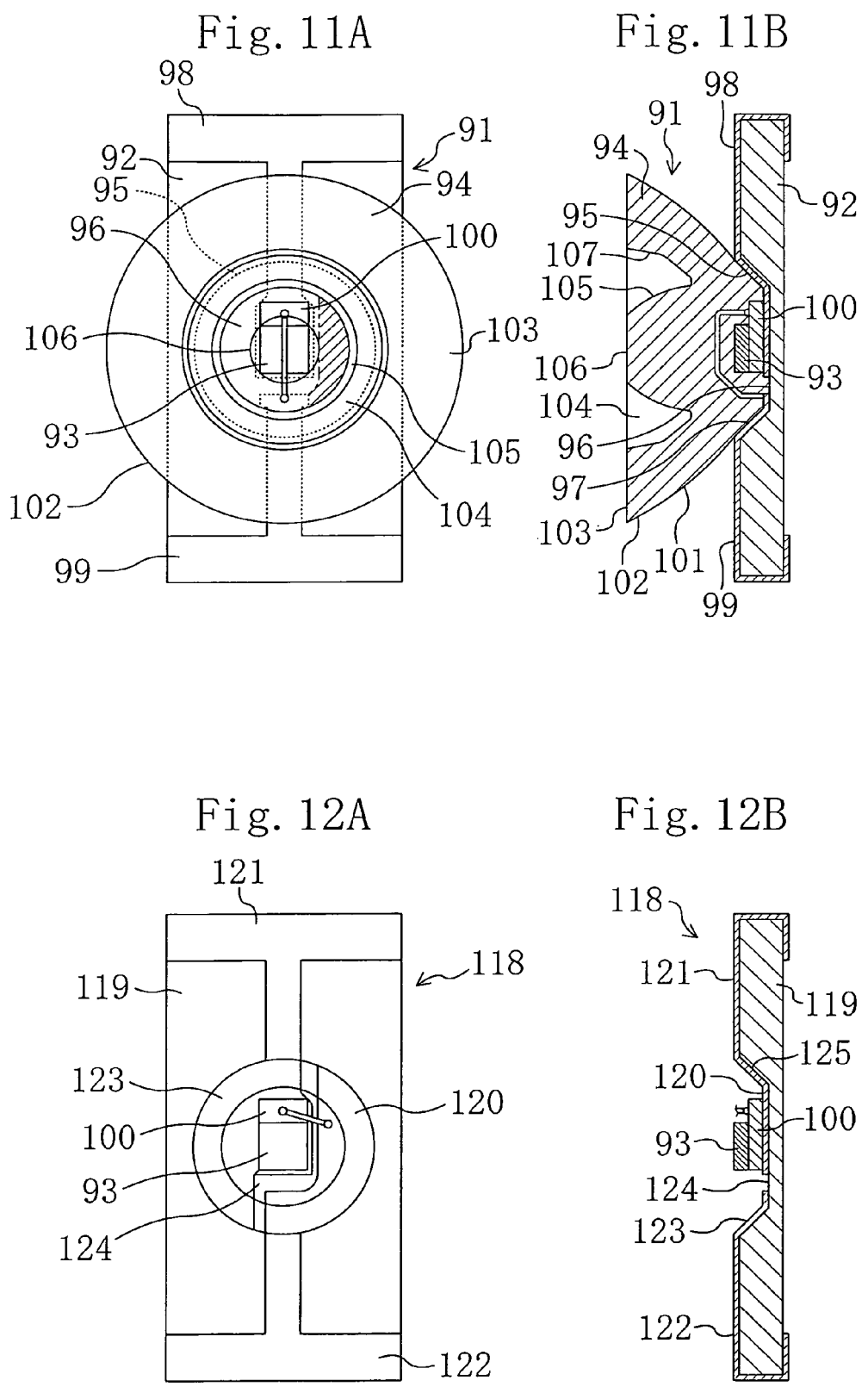

FIG. 11(A) is a plan view showing a light-emitting diode according to a sixth embodiment of the present invention. FIG. 11(B) is a cross-sectional view showing the light-emitting diode.

As shown in FIG. 11, a light-emitting diode 91 includes: a semiconductor light-emitting device 93 mounted over a printed wiring board 92; and a transparent resin package 94 covering the semiconductor light-emitting device 93.

The printed wiring board 92 is a rectangle and has electrode patterns 98 and 99 at both ends thereof.

A recess 95 is formed in the front face of the printed wiring board 92 and does not penetrate the printed wiring board 92. The recess 95 has a circular bottom 96 and a curved face 97 surrounding the bottom 96 and formed by a paraboloid of revolution. The center line of this paraboloid passes the center of the bottom 96 and is parallel to the direction normal to the printed wiring board 92. The bottom 96 and the curved face 97 of the recess 95 is coated with an insulating white paint (reflectorized paint) containing a reflective material such as titanium oxide.

The electrode patterns 98 and 99 of the printed wiring board 92 extend from both ends of the printed wiring board 92 into the recess 95 and are opposed to each other at both sides of the printed wiring board 92 in the longitudinal direction. The electrode patterns 98 and 99 are obtained by applying a Ni/Au coating to an etching pattern made of Cu. This process ensures both wire bonding and reflow soldering during surface mounting.

The semiconductor light-emitting device 93 is connected to the electrode pattern 98 on the surface of the printed wiring board 92 by die bonding, with a submount device 100 interposed therebetween. More specifically, the submount device 100 is located on the bottom 96 near a side thereof. The semiconductor light-emitting device 93 whose back face is smaller than the front face of the submount device 100 is mounted on the submount device 100 such that the center of the semiconductor light-emitting device 93 coincides with the circular bottom face 96. A wire bonding portion is provided in part of the front face of the submount device 100 on which the semiconductor light-emitting device 93 is not mounted.

The electrode pattern 99 is placed at the side of the submount device 100 opposite the wire bonding portion with respect to the semiconductor light-emitting device 93. A wire extends across the front side of the semiconductor light-emitting device 93 to connect the electrode pattern 99 and the submount device 100 to each other.

The face at the front side herein is the face of the printed wiring board 92 on which the recess 95 is formed.

The wire is small in diameter, so that most part of light is emitted from the semiconductor light-emitting device 93. As indicated by dash-double-dot lines and sloped lines in FIG. 11(A), the electrode pattern 99 extends to a portion adjacent to the wire bonding portion of the submount device 100 on the bottom 96. If the wire is connected to this extended portion, light emitted from the semiconductor light-emitting device 93 is not blocked by the wire, thereby increasing the amount of light emitted from the semiconductor light-emitting device 93 toward the front.

In this embodiment, the semiconductor light-emitting device 93 is located in the recess 95 of the printed wiring board 92, so that it is possible to prevent light emitted from the semiconductor light-emitting device 93 from leaking toward the back of the printed wiring board 92.

The resin package 94 is made of, for example, a resin such as transparent epoxy resin and includes: a base portion cured to cover the entire semiconductor light-emitting device 93 and parts of the electrode patterns 98 and 99 in the recess 95 of the printed wiring board 92; and an expansion portion 102 projecting toward the front from the front face of the printed wiring board 92 and having a curved face 101 gradually expanding toward the front to cause total reflection of light emitted from the semiconductor light-emitting device 93 toward the sides and make the reflected light released to the front.

The curved face 101 is a first curved face which is a paraboloid of revolution. The curved face 97 of the recess 95 in the printed wiring board 92 is a second curved face. The base end of the curved face 101 is connected to the front end of the curved face 97.

An annular flat portion 103 perpendicular to the optical axis of the semiconductor light-emitting device 93 is provided in the periphery of the front face of the resin package 94. An adjusting recess 104 for adjusting a light distribution area is provided in the annular flat portion 103. A convex lens portion 105 whose optical axis coincides with the optical axis of the semiconductor light-emitting device 93 is provided in the adjusting recess 104.

A circular flat portion 106 is provided at the front end of the convex lens portion 105. The circular flat portion 106 is flush with the annular flat portion 103. That is, the convex lens portion 105 does not project from the adjusting recess 104. The circular flat portion 106 surrounds the entire periphery of the rectangular semiconductor light-emitting device 93 when viewed from the front. The adjusting recess 104 has a recessed curved face 107 connecting the outer edge of the convex lens portion 105 and the inner edge of the annular flat portion 103.

Now, a method for fabricating the light-emitting diode 91 will be described.

First, the surface of the printed wiring board 92 is cut with a bit in accordance with the shape of the curved face 97. Then, electrode patterns 98 and 99 are formed by a process such as plating and etching. Thereafter, an insulating white paint is applied to the bottom 96 and the curved face 97 of the recess 95.

Next, the semiconductor light-emitting device 93 is mounted over the electrode patterns 98 and 99. Procedures for this mounting are the same as those in the process of fabricating a conventional light-emitting diode, and description thereof will be herein omitted A mold for transfer molding is used to form the resin package 94. In this case, a pair of molds movable toward the front and the back of the printed wiring board 92 is used and a mold capable of sliding to both sides is used to form the curved face 101. The use of the sliding mold allows formation even of a configuration in which the curved face 101 projects toward the back.

Now, the state in which the light-emitting diode 91 is used will be described.

The light-emitting diode 91 is used as a device of a surface mounting type. Part of light emitted from the semiconductor light-emitting device 93 along the optical axis is emitted to the outside from the circular flat portion 106 and travels in a straight line without change. Light falling on the side face of the convex lens portion 105 is refracted inward along radii with respect to the optical axis and is emitted to the outside from the convex lens portion 105. The convex lens portion 105 and the recessed curved face 107 are formed in such shapes that prevent light emitted to the outside from the convex lens portion 105 from striking the recessed curved face 107 again.

Light emitted from the semiconductor light-emitting device 93 toward the sides reaches the curved face 97 or the curved face 101. The curved face 97 and the curved face 101 are paraboloids of revolution and designed such that most of the incident angles of light beams emitted from the semiconductor light-emitting device 93 are 40° or more. In this case, if the material for the resin is changed, the total reflection angle is adjusted in accordance with the refractive index of this resin. Accordingly, it is enough to change the location of the semiconductor light-emitting device.

If light is reflected from another member, light irregularly reflected from the interface is absorbed by another member, resulting in poor reflection efficiency. Therefore, it is more efficient to cause total reflection from the surface of the resin. On the other hand, if the angle of light incident on the side face of the resin package 94 is small, light passes through the resin outward, so that the reflection efficiency decreases extremely.

In this embodiment, two types of the curved faces 97 and 101 are provided. Light emitted from the semiconductor light-emitting device 93 strikes the curved face 101 at an incident angle larger than that of light incident on the curved face 97. Accordingly, efficient total reflection of light incident on the curved face 101 occurs. On the other hand, light emitted from the semiconductor light-emitting device 93 obliquely backward (toward the backside) strikes the curved face 97 at an incident angle less than 40°. However, since the curved face 97 is in contact with the side faces of the recess in the printed wiring board 92, light is reflected efficiently without being emitted to the outside from the curved face 97. In addition, light emitted from the semiconductor light-emitting device 93 backward (toward the backside) is reflected from the bottom 96 and the front faces of the electrode patterns 98 and 99 toward the front.

In this embodiment, the semiconductor light-emitting device 93 is mounted over the bottom 96 of the recess 95 with the submount device 100 interposed therebetween, so that the position of the light-emitting surface of the semiconductor light-emitting device 93 is moved toward the front. Accordingly, the amount of light incident on the curved face 101 is increased, and light is efficiently reflected.

The base portion of the resin package 94 is fitted in the recess 95, so that strength against disconnection is enhanced as compared to a case where a resin package is formed on a flat face of a board.

Embodiment 7

FIG. 12(A) is a plan view before a resin package for a light-emitting diode according to a seventh embodiment of the present invention is formed. FIG. 12(B) is a side cross-sectional view before the resin package of the light-emitting diode is formed.

The light-emitting diode 118 of this embodiment is different from the light-emitting diode 91 of the sixth embodiment only in the configuration of electrode patterns and placement of a wire. The other configurations of these diodes are similar to each other.

In the light-emitting diode 118, a curved face (second curved face) 125 constituting the side face of a recess 120 formed in a printed wiring board 119 is covered with the same metal as that constituting electrode patterns 121 and 122, thereby forming a reflective face 123.

The electrode pattern 121 covers an end of the printed wiring board 119, covers about half of the periphery of the curved face 125 in the recess 120 and also covers about half of the bottom 124 of the recess 120. The electrode pattern 122 covers the other end of the printed wiring board 119, covers about half of the curved face 125 in the recess 120 and also covers about half of the bottom 124 of the recess 120. The electrode patterns 121 and 122 in the recess 120 are spaced at a small distance enough to prevent a short circuit.

A semiconductor light-emitting device 93 is mounted over a submount device 100. The submount device 100 is connected to the electrode pattern 121 by die bonding and connected to the electrode pattern 122 by wire bonding. A wire is connected to a portion adjacent to a die bonding portion of the submount device 100 and is located so as not to block light emitted from the semiconductor light-emitting device 93 toward the front. The other part of the configuration is the same as in the sixth embodiment, and the description thereof will be omitted.

In this embodiment, the reflective face 123 is provided, so that this reflective face also serves as electrodes, thus enhancing reflectance of light and efficiency in fabrication.

INDUSTRIAL APPLICABILITY

A light-emitting diode according to the present invention has high industrial applicability in the following aspects. The light-emitting diode exhibits high luminance and emits light uniformly. Components of this light-emitting diode are not readily removed from supporting members such as lead frames. The light-emitting diode can have its packaging density increased and can be miniaturized. The light-emitting diode emits light under the same conditions independently of the orientation of a device.

The invention claimed is:

1. A light-emitting diode comprising: at least one semiconductor light-emitting device mounted over the surface of a lead frame; and a transparent resin package covering the semiconductor light-emitting device, wherein the resin package includes a base portion covering a base part of the lead frame, an expansion portion provided at a side of the base portion toward a principal-light-emitting surface of the semiconductor light-emitting device and having a side face which is a first curved face capable of causing total reflection of light emitted from the semiconductor light-emitting device and making the reflected light released toward the front, and a contraction portion located between the expansion portion and the base portion and has a lateral cross section smaller than a maximum lateral cross section of the base portion.

2. The light-emitting diode of claim 1, wherein a convex lens portion for concentrating, toward the front, light emitted from the semiconductor light-emitting device is provided in a surface part of the resin package, and a diffusing part for diffusing light emitted from the semiconductor light-emitting device toward the sides is formed in a part of the convex lens portion intersecting an optical axis of the convex lens portion.

3. The light-emitting diode of claim 2, wherein the diffusing part is flat.

4. The light-emitting diode of claim 2, wherein a part of the convex lens portion surrounding the diffusing part is a convex-lens side face, and a recess whose side wall is partly the convex-lens side face is provided to surround the convex lens portion.

5. The light-emitting diode of claim 1, wherein the first curved face of the expansion portion has a lateral cross section including an arc using an optical axis of the semiconductor light-emitting device as the center of the arc.

6. The light-emitting diode of claim 1, wherein a plurality of said semiconductor light-emitting devices are provided, and the first curved face of the expansion portion has a lateral cross section formed by connecting arcs using optical axes of the semiconductor light-emitting devices as the centers of the arcs.

7. The light-emitting diode of claim 1, wherein the first curved face of the expansion portion includes a paraboloid of revolution.

8. The light-emitting diode of claim 1, wherein part of the lead frame projects from the resin package, the base portion projects from the contraction portion along the direction in which the lead frame projects, and a backside end of the base portion has a width equal to that of a front-side end of the contraction portion in a direction perpendicular to the direction in which the lead frame projects.

9. The light-emitting diode of claim 1, wherein the semiconductor light-emitting device is mounted over the lead frame with a submount device interposed therebetween.

10. The light-emitting diode of claim 1, wherein a phosphor is printed on the semiconductor light-emitting device.

11. The light-emitting diode of claim 1, wherein a plurality of said semiconductor light-emitting devices are provided, and the semiconductor light-emitting devices are arranged along a direction perpendicular to the direction in which the lead frame projects.

12. The light-emitting diode of claim 1, wherein the lead frame bends into a gull-wing shape.

13. The light-emitting diode of claim 2, wherein the optical axis of the convex lens portion coincides with an optical axis of the semiconductor light-emitting device.

14. The light-emitting diode of claim 2, wherein no part of the convex lens portion projects from a portion of the surface of the resin package closest to the front.

15. The light-emitting diode of claim 2, wherein a plurality of said semiconductor light-emitting devices are provided, and the convex lens portion is provided in each of the semiconductor light-emitting devices.

16. The light-emitting diode of claim 1, wherein at least three said semiconductor light-emitting devices emitting red light, green light and blue light, respectively, are provided.

17. The light-emitting diode of claim 1, wherein a plurality of said semiconductor light-emitting devices emitting light of the same color are provided, the semiconductor light-emitting devices includes p-electrodes and n-electrodes, the lead frame includes a first frame connected to the p-electrodes and provided with a pair of terminals projecting from the resin package in plan view and also includes a second frame connected to the n-electrodes and provided with a pair of terminals projecting from the resin package in plan view, and the terminals of the first frame are point symmetric with respect to a center of the resin package, and the terminals of the second frame are point symmetric with respect to the center of the resin package.

18. The light-emitting diode of claim 17, wherein the terminals of the first frame are continuous, and the terminals of the second frame are apart from each other with the first frame sandwiched therebetween.

19. The light-emitting diode of claim 17, wherein head parts of the respective terminals of the first frame are parallel to head parts of the respective terminals of the second frame, and the semiconductor light-emitting devices are arranged along a direction perpendicular to the head parts of the terminals of the first frame and the head parts of the terminals of the second frame.

20. The light-emitting diode of claim 17, wherein the first frame includes a device fixing part for fixing back faces of the semiconductor light-emitting devices, and the terminals of the first frame extend in opposite directions respectively from both ends of the device fixing part along a direction perpendicular to a longitudinal direction of the device fixing part, and base parts of the respective terminals of the second frame are located near the device fixing part, and head parts of the respective terminals of the second frame are parallel to the terminals of the first frame.

21. The light-emitting diode of claim 20, wherein a base part of each of the terminals of the second frame bends toward adjacent one of the terminals of first frame in the resin package.

22. A light-emitting diode comprising: at least one semiconductor light-emitting device mounted over the surface of a printed wiring board; and a transparent resin package covering a front side of the semiconductor light-emitting device, wherein the resin package includes an expansion portion having a side face which is a first curved face capable of causing total reflection of light emitted from the semiconductor light-emitting device toward the sides and making the reflected light released toward the front, and a convex lens portion for concentrating light emitted from the semiconductor light-emitting device in the direction in which principal light of the semiconductor light emitting device is emitted is provided in a surface part of the resin package, and a diffusing part for diffusing light emitted from the semiconductor light-emitting device toward the sides is formed in a part of the convex lens portion intersecting an optical axis of the convex lens portion.

23. The light-emitting diode of claim 22, wherein a side face of a recess in the printed wiring board expands toward the front, and
a part of the resin package in contact with the side face of the recess is a second curved face.

24. The light-emitting diode of claim 23, wherein a backside end of the first curved face is connected to a front-side end of the second curved face.

25. The light-emitting diode of claim 23, wherein an electrode made of a metal is provided on part of the surface of the printed wiring board, and
a film made of the same metal as the metal constituting the electrode is interposed between the second curved face of the resin package and the printed wiring board.

* * * * *

UNITED STATES PATENT AND TRADEMARK OFFICE
CERTIFICATE OF CORRECTION

| | | |
|---|---|---|
| PATENT NO. | : 7,347,603 B2 | Page 1 of 1 |
| APPLICATION NO. | : 10/532813 | |
| DATED | : March 25, 2008 | |
| INVENTOR(S) | : Tadaaki Ikeda et al. | |

It is certified that error appears in the above-identified patent and that said Letters Patent is hereby corrected as shown below:

On the Title page, in Item "(56) References Cited", under "Foreign Patent Documents", change "JP   06-107235   04/1996" to --JP   08-107235   04/1996--.

Signed and Sealed this

Seventh Day of October, 2008

JON W. DUDAS
*Director of the United States Patent and Trademark Office*